(12) United States Patent
Torii

(10) Patent No.: US 10,711,088 B2
(45) Date of Patent: Jul. 14, 2020

(54) RESIN COMPOSITION, SHEET-SHAPED LAMINATED MATERIAL, PRINTED WIRING BOARD, AND SEMICONDUCTOR DEVICE

(71) Applicant: AJINOMOTO CO., INC., Tokyo (JP)

(72) Inventor: Kota Torii, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 0 days.

(21) Appl. No.: 16/295,077

(22) Filed: Mar. 7, 2019

(65) Prior Publication Data

US 2019/0276585 A1  Sep. 12, 2019

(30) Foreign Application Priority Data

Mar. 8, 2018 (JP) .................................. 2018-042164

(51) Int. Cl.
| | |
|---|---|
| *C08F 18/00* | (2006.01) |
| *C08F 20/00* | (2006.01) |
| *C08F 2/00* | (2006.01) |
| *C08G 61/04* | (2006.01) |
| *C08G 59/24* | (2006.01) |
| *C08K 3/013* | (2018.01) |
| *C08L 63/00* | (2006.01) |
| *C08L 61/06* | (2006.01) |
| *C08L 79/04* | (2006.01) |
| *C08L 79/02* | (2006.01) |
| *C08G 65/18* | (2006.01) |
| *C08L 71/02* | (2006.01) |
| *C08G 59/30* | (2006.01) |
| *H05K 1/03* | (2006.01) |
| *C08L 67/02* | (2006.01) |
| *C08G 59/62* | (2006.01) |
| *C08G 59/42* | (2006.01) |
| *C08G 59/68* | (2006.01) |

(52) U.S. Cl.
CPC ......... *C08G 59/245* (2013.01); *C08G 59/302* (2013.01); *C08G 59/42* (2013.01); *C08G 59/621* (2013.01); *C08G 59/686* (2013.01); *C08G 65/18* (2013.01); *C08K 3/013* (2018.01); *C08L 61/06* (2013.01); *C08L 63/00* (2013.01); *C08L 67/02* (2013.01); *C08L 71/02* (2013.01); *C08L 79/02* (2013.01); *C08L 79/04* (2013.01); *H05K 1/0353* (2013.01); *C08L 2203/206* (2013.01); *C08L 2205/03* (2013.01)

(58) Field of Classification Search
USPC ............................ 526/292.1, 291, 72; 520/1
See application file for complete search history.

(56) References Cited

U.S. PATENT DOCUMENTS

| | | | | |
|---|---|---|---|---|
| 2010/0181684 A1* | 7/2010 | Takahashi | ............... | C08L 63/10 257/774 |
| 2017/0086306 A1* | 3/2017 | Nakamura | ............. | H05K 3/007 |
| 2017/0154841 A1* | 6/2017 | Nakamura | .............. | C08L 63/00 |
| 2017/0221745 A1* | 8/2017 | Ohkoshi | .................. | H05K 3/46 |

FOREIGN PATENT DOCUMENTS

| | | |
|---|---|---|
| JP | 2014-34580 A | 2/2014 |
| JP | 2014-47318 A | 3/2014 |
| JP | 2017088745 * | 5/2017 |

OTHER PUBLICATIONS

Takano et al, JP 2017-088745 Machine Translation, May 25, 2017 (Year: 2017).*

* cited by examiner

*Primary Examiner* — Jessica Whiteley
(74) *Attorney, Agent, or Firm* — Oblon, McClelland, Maier & Neustadt, L.L.P.

(57) ABSTRACT

Provided is a resin composition that can provide a cured product of low dielectric tangent, high mechanical strength, and high adhesiveness. The resin composition contains (A) a resin having a thermosetting functional group FA, (B) a resin having a radical polymerizable functional group FB, and (C) a resin having a functional group FA' reacting with the thermosetting functional group FA and a functional group FB' reacting with the radical polymerizable functional group FB. A number $n_a$ of the functional group FA' of the component (C) when the number of the thermosetting functional group FA of the component (A) is defined as 1 and a number $n_b$ of the functional group FB' of the component (C) when the number of the radical polymerizable functional group FB of the component (B) is defined as 1 satisfy $0.01 \leq n_a \leq 200$ and $0.01 \leq n_b \leq 400$, respectively.

12 Claims, No Drawings

RESIN COMPOSITION, SHEET-SHAPED LAMINATED MATERIAL, PRINTED WIRING BOARD, AND SEMICONDUCTOR DEVICE

CROSS REFERENCES TO RELATED APPLICATIONS

This application claims priority to Japanese Patent Application No. 2018-042164, filed on Mar. 8, 2018, which is incorporated herein by reference in its entirety.

BACKGROUND OF THE INVENTION

Field of the Invention

The present invention relates to a resin composition and further relates to a sheet-shaped laminated material, a printed wiring board, and a semiconductor device.

Discussion of the Background

As a method for producing a printed wiring board, there is known a production method using a build-up process of alternately layering an insulating layer and a conductive layer on an internal layer substrate. The insulating layer is generally formed of a cured product of a resin composition.

For example, JP-A-2014-47318 discloses a thermosetting epoxy resin composition containing an epoxy resin (A) and an active ester compound containing a naphthalene structure (B), in which a content of the active ester compound containing a naphthalene structure (B) is 0.1% by mass to 30% by mass when a content of non-volatile components within the resin composition is defined as 100% by mass.

JP-A-2014-34580 discloses a resin composition containing (A) a radical polymerizable compound, (B) an epoxy resin, (C) a curing agent, and (D) a roughening component.

SUMMARY OF THE INVENTION

An object of the present invention is to provide a resin composition that can provide a cured product of low dielectric tangent, high mechanical strength, and high adhesiveness.

The inventors of the present invention intensively investigated to achieve the object and have found out that the object can be resolved by a resin composition containing, in combination, (A) a resin having a thermosetting functional group FA, (B) a resin having a radical polymerizable functional group FB, and (C) a resin having a functional group FA' reacting with the thermosetting functional group FA and a functional group FB' reacting with the radical polymerizable functional group FB in certain amounts, resulting in the completion of the present invention.

Specifically, the present invention includes the following embodiments.

(1) A resin composition comprising:
(A) a resin having a thermosetting functional group FA;
(B) a resin having a radical polymerizable functional group FB; and
(C) a resin having a functional group FA' reacting with the thermosetting functional group FA and a functional group FB' reacting with the radical polymerizable functional group FB, wherein
a number $n_a$ of the functional group FA' of the component (C) when the number of the thermosetting functional group FA of the component (A) is defined as 1 and a number $n_b$ of the functional group FB' of the component (C) when the number of the radical polymerizable functional group FB of the component (B) is defined as 1 satisfy $0.01 \leq n_a \leq 200$ and $0.01 \leq n_b \leq 400$.

(2) The resin composition according to (1), wherein the thermosetting functional group FA is one or more selected from the group consisting of an epoxy group, a phenolic hydroxy group, a benzoxazine group, a cyanate ester group, an active ester group, a carbodiimide group, an acid anhydride group, an oxetanyl group, an episulfide group, an isocyanate group, and an amino group.

(3) The resin composition according to (1) or (2), wherein the radical polymerizable functional group FB is an ethylenic unsaturated group.

(4) The resin composition according to any one of (1) to (3), wherein the radical polymerizable functional group FB is one or more selected from the group consisting of an acrylic group, a methacrylic group, a styryl group, an allyl group, a vinyl group, a propenyl group, and a maleimide group.

(5) The resin composition according to any one of (1) to (4), wherein the functional group FA' of the component (C) is one or more selected from the group consisting of an epoxy group, a phenolic hydroxy group, a benzoxazine group, a cyanate ester group, an active ester group, a carbodiimide group, an acid anhydride group, an oxetanyl group, an episulfide group, an isocyanate group, and an amino group.

(6) The resin composition according to any one of (1) to (5), wherein the functional group FB' of the component (C) is one or more selected from the group consisting of an acrylic group, a methacrylic group, a styryl group, an allyl group, a vinyl group, a propenyl group, and a maleimide group.

(7) The resin composition according to any one of (1) to (6), further comprising (D) an inorganic filler.

(8) The resin composition according to any one of (1) to (7), wherein the resin composition is for an insulating layer on which a conductive layer is to be formed.

(9) The resin composition according to any one of (1) to (8), wherein the resin composition is for an insulating layer of a printed wiring board.

(10) A sheet-shaped laminated material containing the resin composition according to any one of (1) to (9).

(11) A printed wiring board containing a cured product of the resin composition according to any one of (1) to (9).

(12) A semiconductor device containing a cured product of the resin composition according to any one of (1) to (9).

Advantageous Effects of Invention

The present invention can provide a resin composition providing a cured product of low dielectric tangent, high mechanical strength, and high adhesiveness.

DETAILED DESCRIPTION OF THE PREFERRED EMBODIMENTS

Hereinafter, the present invention will be described in detail with reference to embodiments and examples. However, the present invention is not limited to the following embodiments or examples and can be performed with any modifications made to the extent not departing from the claims of the present invention and equivalents thereof.

In the following description, the content of each component in a resin composition is a value when resin components in the resin composition are determined to be 100% by mass, unless otherwise specified.

In the following description, the "resin components" refer to components other than (D) an inorganic filler (hereinafter, also referred to as a "component (D)" in the present specification) in the non-volatile components contained in the resin composition, unless otherwise specified.

Resin Composition

The resin composition of the present invention contains (A) a resin having a thermosetting functional group FA, (B) a resin having a radical polymerizable functional group FB, and (C) a resin having a functional group FA' reacting with the thermosetting functional group FA and a functional group FB' reacting with the radical polymerizable functional group FB, and is characterized by satisfying $0.01 \leq n_a \leq 200$ and $0.01 \leq n_b \leq 400$ where $n_a$ is a number of the functional group FA' of the component (C) when the number of the thermosetting functional group FA of the component (A) is defined as 1 and $n_b$ is a number of the functional group FB' of the component (C) when the number of the radical polymerizable functional group FB of the component (B) is defined as 1. A cured product formed by curing the resin composition of the present invention includes a molecular structure moiety formed by the reaction of the radical polymerizable functional group FB of the component (B) and the functional group FB' of the component (C). This molecular structure moiety is low in polarity, and thus the polarity of the cured product is low, which can reduce the value of dielectric tangent.

The cured product formed by curing the resin composition of the present invention includes not only the molecular structure moiety formed by the reaction of the radical polymerizable functional group FB of the component (B) and the functional group FB' of the component (C) but also a molecular structure moiety formed by the reaction of the thermosetting functional group FA of the component (A) and the functional group FA' of the component (C). Consequently, the cured product is high in cross-linking density (that is, dense in structure) and improves in mechanical strength, separation accompanied by breakage of the cured product is difficult to occur, and thus adhesiveness between the cured product and an object to which the cured product adheres (a conductive layer or the like) is excellent.

Thus, the resin composition of the present invention can provide a cured product achieving simultaneously both of an effect that can be produced when using the component (A) singly and an effect that can be produced when using the component (B) singly. Furthermore, in the resin composition of the present invention containing the component (C) having reaction sites that can react with the component (A) and the component (B), miscibility of components including the component (A) and the component (B) can be improved compared with a case in which a compound having a thermosetting functional group that can react with the component (A) and a compound having a radical polymerizable functional group that can react with the component (C) are separately contained. Consequently, composition uniformity of the cured product can be improved, and thus the above effects can be obtained at a higher level.

In view of achieving a resin composition providing a cured product of low dielectric tangent, high mechanical strength and high adhesiveness, it is important to satisfy the conditions for the number $n_a$ of the functional group FA' of the component (C) when the number of the thermosetting functional group FA of the component (A) is defined as 1 and the number $n_b$ of the functional group FB' of the component (C) when the number of the radical polymerizable functional group FB of the component (B) is defined as 1 such that $0.01 \leq n_a \leq 200$ and $0.01 \leq n_b \leq 400$. As described below, the inventors of the present invention have found that, when $n_a$ and $n_b$ satisfy the above conditions, there can achieve a resin composition providing a cured product less in degradation of adhesiveness even under a high-temperature and high-humidity environment. Here, $n_a$ can be determined by formula: $n_a = (M_C/Eq_{FA'})/(M_A/Eq_{FA})$, using parts by mass ($M_A$) of the component (A), a thermosetting functional group FA equivalent ($Eq_{FA}$) of the component (A), parts by mass ($M_C$) of the component (C), and a functional group FA' equivalent ($Eq_{FA'}$) of the component (C). Similarly, $n_b$ can be determined by formula: $n_b = (M_C/Eq_{FB'})/(M_B/Eq_{FB})$, using parts by mass ($M_B$) of the component (B), a radical polymerizable functional group FB equivalent ($Eq_{FB}$) of the component (B), parts by mass ($M_C$) of the component (C), and a functional group FB' equivalent ($Eq_{FB'}$) of the component (C). When using a plurality of resins of different equivalent value in a mixed manner for the component (A), the sum of value of the parts by mass/equivalent value of each resin may be used for ($M_A/Eq_{FA}$). When using a plurality of resins of different equivalent value in a mixed manner for the component (B), the sum of value of the parts by mass/equivalent value of each resin may be used for ($M_B/Eq_{FB}$). The same holds true for ($M_C/Eq_{FA'}$) and ($M_C/Eq_{FB'}$) about the component (C). The thermosetting functional group FA equivalent ($Eq_{FA}$) of the component (A) is the mass of the resin containing one equivalent of the thermosetting functional group FA and can be measured in accordance with JIS K7236. The same holds true for the radical polymerizable functional group FB equivalent ($Eq_{FB}$) of the component (B) and the functional group FA' equivalent ($Eq_{FA'}$) and the functional group FB' equivalent ($Eq_{FB'}$) of the component (C).

In view of achieving a resin composition providing a cured product more excellent in dielectric tangent, mechanical strength and adhesiveness, and particularly in view of achieving a resin composition providing a cured product less in degradation of adhesiveness even under a high-temperature and high-humidity environment, $n_a$ is preferably 0.05 or more, more preferably 0.1 or more, and even more preferably 0.15 or more, 0.2 or more, 0.3 or more, 0.4 or more, or 0.5 or more. The upper limit of $n_a$ is preferably 180 or less, more preferably 160 or less, and even more preferably 150 or less, 140 or less, 130 or less, 120 or less, 110 or less, or 100 or less.

In view of achieving a resin composition providing a cured product more excellent in dielectric tangent, mechanical strength and adhesiveness, and particularly in view of achieving a resin composition providing a cured product less in degradation of adhesiveness even under a high-temperature and high-humidity environment, $n_b$ is preferably 0.05 or more, more preferably 0.1 or more, and even more preferably 0.2 or more, 0.3 or more, 0.4 or more, 0.5 or more, or 1 or more. The upper limit of $n_b$ is preferably 350 or less, more preferably 300 or less, and even more preferably 250 or less, 240 or less, 230 or less, 220 or less, 210 or less, or 200 or less.

(A) Resin having Thermosetting Functional Group FA

The resin composition of the present invention contains the resin having the thermosetting functional group FA as the component (A). The cured product has the molecular structure moiety formed by the reaction of the thermosetting functional group FA of the component (A) and the functional group FA' of the component (C), thereby providing a cured product of dense structure, high mechanical strength, and excellent adhesiveness.

In view of achieving a cured product excellent in dielectric tangent, mechanical strength and adhesiveness in combination with the component (B) and the component (C), preferred examples of the thermosetting functional group FA include an epoxy group, a phenolic hydroxy group, a benzoxazine group, a cyanate ester group, an active ester group, a carbodiimide group, an acid anhydride group, an oxetanyl group, an episulfide group, an isocyanate group, and an amino group. The component (A) may have one or two or more thermosetting functional groups FA.

The component (A) refers to a resin that has the thermosetting functional group FA and does not have any radical polymerizable functional groups such as the functional groups FB and FB' described below.

Preferred examples of the component (A) include an epoxy resin, a phenol resin, a naphthol resin, a benzoxazine resin, a cyanate ester resin, an active ester resin, a carbodiimide resin, an acid anhydride resin, an oxetane resin, an episulfide resin, an isocyanate resin, an amino resin, and reaction products of these resins. The component (A) may be contained singly or contained with two or more combined.

Epoxy Resin

Examples of the epoxy resin include a bisphenol type epoxy resin, a dicyclopentadiene type epoxy resin, a trisphenol type epoxy resin, a naphthol novolak type epoxy resin, a phenol novolak type epoxy resin, a tert-butylcatechol type epoxy resin, a naphthalene type epoxy resin, a naphthol type epoxy resin, an anthracene type epoxy resin, a glycidyl amine type epoxy resin, a glycidyl ester type epoxy resin, a cresol novolak type epoxy resin, a biphenyl type epoxy resin, a linear aliphatic epoxy resin, an epoxy resin having a butadiene structure, an alicyclic epoxy resin, a heterocyclic epoxy resin, a spiro ring-containing epoxy resin, a cyclohexane dimethanol type epoxy resin, a naphthylene ether type epoxy resin, a trimethylol type epoxy resin, a tetraphenylethane type epoxy resin, and a halogenated epoxy resin. The bisphenol type epoxy resin refers to an epoxy resin having a bisphenol structure; examples thereof include a bisphenol A type epoxy resin, a bisphenol F type epoxy resin, a bisphenol S type epoxy resin, and a bisphenol AF type epoxy resin. The biphenyl type epoxy resin refers to an epoxy resin having a biphenyl structure, in which the biphenyl structure may have a substituent such as an alkyl group, an alkoxy group, or an aryl group. Consequently, the biphenyl type epoxy resin includes a bixylenol type epoxy resin.

Among these, in view of improving adhesiveness, the epoxy resin is preferably a bisphenol A type epoxy resin, a bisphenol F type epoxy resin, a bisphenol AF type epoxy resin, a naphthol type epoxy resin, a naphthalene type epoxy resin, a biphenyl type epoxy resin, a naphthylene ether type epoxy resin, a glycidyl ester type epoxy resin, or an anthracene type epoxy resin. In view of reducing an average coefficient of linear thermal expansion, an epoxy resin containing an aromatic skeleton is preferred. The aromatic skeleton is a concept also including a polycyclic aromatic skeleton and an aromatic heterocycle. The epoxy resin containing an aromatic skeleton is preferably one or more epoxy resins selected from the group consisting of a bisphenol A type epoxy resin, a bisphenol F type epoxy resin, a bisphenol AF type epoxy resin, a naphthalene type epoxy resin, a biphenyl type epoxy resin, a dicyclopentadiene type epoxy resin, and a naphthol type epoxy resin.

The epoxy resin preferably has two or more epoxy groups per molecule. The proportion of the epoxy resin having two or more epoxy groups per molecule relative to 100% by mass of a non-volatile component of the epoxy resin is preferably 50% by mass or more, more preferably 60% by mass or more, and particularly preferably 70% by mass or more. In particular, the epoxy resin preferably contains an epoxy resin that has three or more epoxy groups per molecule and is solid at a temperature of 20° C. (hereinafter, may be referred to as a "solid epoxy resin").

The epoxy resin may contain only the solid epoxy resin or contain the solid epoxy resin and another epoxy resin in combination. In particular, the epoxy resin preferably contains the solid epoxy resin and an epoxy resin that has two or more epoxy groups per molecule and is liquid at a temperature of 20° C. (hereinafter, may be referred to as a "liquid epoxy resin") in combination. The liquid epoxy resin and the solid epoxy resin are contained in combination, whereby the flexibility of the resin composition can be improved, or the breaking strength of the cured product of the resin composition can be improved.

The liquid epoxy resin is preferably a bisphenol A type epoxy resin, a bisphenol F type epoxy resin, a bisphenol AF type epoxy resin, a naphthalene type epoxy resin, a glycidyl ester type epoxy resin, a glycidyl amine type epoxy resin, a phenol novolak type epoxy resin, an alicyclic epoxy resin having an ester skeleton, a cyclohexane dimethanol type epoxy resin, a glycidyl amine type epoxy resin, or an epoxy resin having a butadiene structure; more preferably, a glycidyl amine type epoxy resin, a bisphenol A type epoxy resin, a bisphenol F type epoxy resin, a bisphenol AF type epoxy resin, and a naphthalene type epoxy resin.

Examples of the liquid epoxy resin include "HP4032", "HP4032D", and "HP4032SS" (naphthalene type epoxy resins) manufactured by DIC Corporation; "YL980", "828US", "jER828EL", "825", and "Epicoat 828EL" (bisphenol A type epoxy resins) manufactured by Mitsubishi Chemical Corporation; "jER806H", "jER807", "YL983U", and "1750" (bisphenol F type epoxy resins) manufactured by Mitsubishi Chemical Corporation; "jER152" (a phenol novolak type epoxy resin) manufactured by Mitsubishi Chemical Corporation; "630" and "630LSD" (glycidyl amine type epoxy resins) manufactured by Mitsubishi Chemical Corporation; "ZX1059" (a mixed product of a bisphenol A type epoxy resin and a bisphenol F type epoxy resin) manufactured by Nippon Steel & Sumikin Chemical Co., Ltd.; "EX-721" (a glycidyl ester type epoxy resin) manufactured by Nagase ChemteX Corporation; "Celloxide 2021P" (an alicyclic epoxy resin having an ester skeleton) manufactured by Daicel Corporation; "PB-3600" (an epoxy resin having a butadiene structure) manufactured by Daicel Corporation; and "ZX1658" and "ZX1658GS" (liquid 1,4-glycidyl cyclohexane type epoxy resins) manufactured by Nippon Steel & Sumikin Chemical Co., Ltd.

The solid epoxy resin is preferably a naphthalene type epoxy resin, a naphthalene type tetrafunctional epoxy resin, a cresol novolak type epoxy resin, a dicyclopentadiene type epoxy resin, a trisphenol type epoxy resin, a naphthol type epoxy resin, a biphenyl type epoxy resin, a naphthylene ether type epoxy resin, an anthracene type epoxy resin, a bisphenol A type epoxy resin, or a tetraphenylethane type epoxy resin; and more preferably, a naphthalene type epoxy resin, a naphthalene type tetrafunctional epoxy resin, a naphthol type epoxy resin, and a biphenyl type epoxy resin.

Examples of the solid epoxy resin include "HP4032H" (a naphthalene type epoxy resin) manufactured by DIC Corporation; "HP-4700" and "HP-4710" (naphthalene type tetrafunctional epoxy resins) manufactured by DIC Corporation; "N-690" and "N-695" (cresol novolak type epoxy resins) manufactured by DIC Corporation; "HP-7200", "HP-7200HH", and "HP-7200H" (dicyclopentadiene type epoxy resins) manufactured by DIC Corporation; "EXA-7311", "EXA-7311-G3", "EXA-7311-G4", "EXA-7311-G4S", and "HP6000" (naphthylene ether type epoxy resins) manufactured by DIC Corporation; "EPPN-502H" (a trisphenol type epoxy resin) manufactured by Nippon Kayaku Co., Ltd.; "NC7000L" (a naphthol novolak type epoxy resin) manufactured by Nippon Kayaku Co., Ltd.; "NC3000H", "NC3000", "NC3000L", and "NC3100" (biphenyl type epoxy resins) manufactured by Nippon Kayaku Co., Ltd.; "ESN475V" (a naphthol naphthalene type epoxy resin) manufactured by Nippon Steel & Sumikin Chemical Co., Ltd.; "ESN485" (a naphthol novolak type epoxy resin) manufactured by Nippon Steel & Sumikin Chemical Co., Ltd.; "YL6121", "YX4000H", "YX4000", and "YX4000HK" (biphenyl type epoxy resins) manufactured by Mitsubishi Chemical Corporation; "YX8800" (an anthracene type epoxy resin) manufactured by Mitsubishi Chemical Corporation; "PG-100" and "CG-500" manufactured by Osaka Gas Chemicals Co., Ltd.; "YL7760" (a bisphenol AF type epoxy resin) manufactured by Mitsubishi Chemical Corporation; "YL7800" (a fluorene type epoxy resin) manufactured by Mitsubishi Chemical Corporation; "jER1010" (a solid bisphenol A type epoxy resin) manufactured by Mitsubishi Chemical Corporation; and "jER1031S" (a tetraphenylethane type epoxy resin) manufactured by Mitsubishi Chemical Corporation.

When using the liquid epoxy resin and the solid epoxy resin in combination, their mass ratio (the liquid epoxy resin:the solid epoxy resin) is preferably 1:0.1 to 1:15, more preferably 1:0.5 to 1:10, and particularly preferably 1:1 to 1:8. The mass ratio of the liquid epoxy resin being in the range can achieve sufficient flexibility, improve handleability, and achieve sufficient flowability during lamination when being used in the form of a sheet-shaped laminated material. The mass ratio of the solid epoxy resin being in the range reduces the viscosity of the epoxy resin and can improve deaerating performance during vacuum lamination when being used in the form of a sheet-shaped laminated material. In addition, separability of a protection film or a support film is made favorable during vacuum lamination, and heat resistance after curing can be improved.

Phenol Resin and Naphthol Resin

In view of heat resistance and water resistance, the phenol resin and the naphthol resin are preferably a phenol resin having a novolak structure or a naphthol resin having a novolak structure. In view of adhesiveness with a conductive layer, preferred are a nitrogen-containing phenol resin and a nitrogen-containing naphthol resin. More preferred are a triazine skeleton-containing phenol resin and a triazine skeleton-containing naphthol resin. Among them, in view of satisfying heat resistance, water resistance, and adhesiveness with a conductive layer at a high level, a triazine skeleton-containing phenol novolak resin is preferred.

Specific Examples of the phenol resin and the naphthol resin include "MEH-7700", "MEH-7810", and "MEH-7851" manufactured by Meiwa Plastic Industries, Ltd.; "NHN", "CBN", and "GPH" manufactured by Nippon Kayaku Co., Ltd.; "SN-170", "SN-180", "SN-190", "SN-475", "SN-485", "SN-495", "SN-375", and "SN-395" manufactured by Nippon Steel & Sumikin Chemical Co., Ltd.; and "LA-7052", "LA-7054", "LA-3018", "LA-1356", and "TD2090" manufactured by DIC Corporation.

Benzoxazine Resin

Examples of the benzoxazine resin include 6,6-(1-methylethylidene)bis(3,4-dihydro-3-phenyl-2H-1,3-benzoxazine) and 6,6-(1-methylethylidene)bis(3,4-dihydro-3-methyl-2H-1,3-benzoxazine). The benzoxazine resin may include a structure in which its oxazine ring is ring-opening polymerized. Specific examples of the benzoxazine resin include "HFB2006M" manufactured by Showa Highpolymer Co., Ltd., "P-d" and "F-a" manufactured by Shikoku Chemicals Corporation, and "RLV-100" manufactured by Air Water Inc.

Cyanate Ester Resin

Examples of the cyanate ester resin include bifunctional cyanate resins such as bisphenol A dicyanate, polyphenol cyanate (oligo(3-methylene-1,5-phenylene cyanate)), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl) methane, 1,3-bis(4-cyanatephenyl-1-(methylethylidene)) benzene, bis(4-cyanatephenyl)thioether, and bis(4-cyanatephenyl) ether; polyfunctional cyanate resins derived from phenol novolak, cresol novolak, and the like; and prepolymers in which these cyanate resins have been partly triazinized. Specific examples of the cyanate ester resin include "PT30" and "PT60" (phenol novolak type polyfunctional cyanate ester resins) and "BA230" (prepolymer in which bisphenol A dicyanate is partly or entirely triazinized to form a trimer) manufactured by Lonza Japan Ltd.

Active Ester Resin

The active ester resin is not particularly limited, and a compound having two or more highly reactive ester groups per molecule, such as phenol esters, thiophenol esters, N-hydroxyamine esters, and esters of heterocyclic hydroxy compounds, is generally preferably used. The active ester resin is preferably obtained by a condensation reaction of a carboxylic acid compound and/or a thiocarboxylic compound with a hydroxy compound and/or a thiol compound. In order to especially enhance the heat resistance, an active ester resin obtained from a carboxylic acid compound and a hydroxy compound is preferable, and an active ester resin obtained from a carboxylic acid compound and a phenol compound and/or a naphthol compound is more preferable. Examples of the carboxylic acid compound include benzoic acid, acetic acid, succinic acid, maleic acid, itaconic acid, phthalic acid, isophthalic acid, terephthalic acid, and pyromellitic acid. Examples of the phenol compound and the naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadiene type diphenol compounds, and phenol novolak. The "dicyclopentadiene type diphenol compounds" refer to diphenol compounds obtained by causing two phenol molecules to condense with one dicyclopentadiene molecule.

Specifically, an active ester resin including a dicyclopentadiene type diphenol structure, an active ester resin including a naphthalene structure, an active ester resin including an acetylated product of phenol novolak, and an active ester resin including a benzoylated product of phenol novolak are preferable. Among them, an active ester resin including a naphthalene structure and an active ester resin including a dicyclopentadiene type diphenol structure are more preferable. The "dicyclopentadiene type diphenol structure" represents a divalent structural unit of phenylene-dicyclopentadiene-phenylene.

Specific examples of the active ester resin include "EXB9451", "EXB9460", "EXB9460S", and "HPC-8000-

65T" (manufactured by DIC Corporation) as active ester resins including a dicyclopentadiene type diphenol structure; "EXB9416-70BK" (manufactured by DIC Corporation) as an active ester resin including a naphthalene structure; "DC808" (manufactured by Mitsubishi Chemical Corporation) as an active ester resin including an acetylated product of phenol novolak; and "YLH1026" (manufactured by Mitsubishi Chemical Corporation) as an active ester resin including a benzoylated product of phenol novolak.

Carbodiimide Resin

Examples of the carbodiimide resin include resins having one or more carbodiimide groups (—N═C═N—) in the molecule. The carbodiimide resin preferably has two or more carbodiimide groups in the molecule. Specific examples of the carbodiimide resin include "V-03" and "V-07" manufactured by Nisshinbo Chemical Inc.

Acid Anhydride Resin

Examples of the acid anhydride resin include resins having one or more acid anhydride groups in the molecule. Examples of the acid anhydride resin include phthalic anhydride, tetrahydro phthalic anhydride, hexahydro phthalic anhydride, methyl tetrahydro phthalic anhydride, methyl hexahydro phthalic anhydride, methylnadic anhydride, hydrogenated methylnadic anhydride, trialkyl tetrahydrophthalic anhydride, dodecenyl succinic anhydride, 5-(2,5-dioxotetrahydro-3-furanyl)-3-methyl-3-cyclohexene-1,2-dicaroxylic anhydride, trimellitic anhydride, pyromellitic anhydride, benzophenone tetracarboxylic dianhydride, biphenyltetracarboxylic dianhydride, naphthalene tetracarboxylic dianhydride, oxydiphthalic dianhydride, 3,3'-4,4'-diphenyl sulfone tetracarboxylic dianhydride, 1,3,3a,4,5,9b-hexahydro-5-(tetrahydro-2,5-dioxo-3-furanyl)-naphtho[1,2-C]furan-1,3-dione, ethylene glycol bis(anhydrotrimellitate), and polymer type acid anhydrides such as styrene maleic acid resin through copolymerization of styrene and maleic acid. Specific examples of the acid anhydride resin include "MH-700" manufactured by New Japan Chemical Co., Ltd.

Oxetane Resin

Examples of the oxetane resin include resins having one or more oxetanyl groups in the molecule. Examples of the oxetane resin include oxetane; alkyl oxetanes such as 2-methyl oxetane, 2,2-dimethyl oxetane, 3-methyl oxetane, and 3,3-dimethyl oxetane; 3-methyl-3-methoxymethyl oxetane; 3,3-di(trifluoromethyl)perfluoro oxetane; 2-chloromethyl oxetane; 3,3-bis(chloromethyl)oxetane; and biphenyl type oxetane. Specific examples of the oxetane resin include "OXT-101" and "OXT-121" manufactured by Toagosei Co., Ltd.

Episulfide Resin

Examples of the episulfide resin include resins having one or more episulfide groups in the molecule. The episulfide resin preferably has two or more episulfide groups in the molecule. Examples of the episulfide resin include a bisphenol type episulfide resin, a naphthalene type episulfide resin, a novolak type episulfide resin, and a biphenyl type episulfide resin. Specific examples of the episulfide resin include "YL7000" manufactured by Mitsubishi Chemical Corporation.

Isocyanate Resin

Examples of the isocyanate resin include resins having one or more isocyanate groups in the molecule. The isocyanate resin preferably has two or more isocyanate groups in the molecule. Examples of the isocyanate resin include 4,4'-diphenylmethane diisocyanate, polymethylene polyphenyl polyisocyanate, tolylene diisocyanate, and hexamethylene diisocyanate.

Amino Resin

Examples of the amino resin include a melamine resin, a benzoguanamine resin, an acetoguanamine resin, a spiroguanamine resin, and a cyclohexylguanamine resin. Specific examples of the amino resin include Cymel series manufactured by Mitsui Cyanamid Ltd. and Nikalac series manufactured by Sanwa Chemical Co., Ltd.

In view of making the cross-linking density of a cured product sufficient and achieving a resin composition providing a cured product of excellent mechanical strength and adhesiveness, the thermosetting functional group FA equivalent of the component (A) is preferably 5,000 or less, more preferably 3,000 or less, and even more preferably 2,000 or less, or 1,000 or less. The lower limit of the thermosetting functional group FA equivalent is not particularly limited so long as the effects of the present invention are produced, and may be 50 or more, 80 or more, 100 or more, or 110 or more.

The weight average molecular weight of the component (A) is preferably 100 to 5,000, more preferably 250 to 4,000, and even more preferably 400 to 3,000. The weight average molecular weight of the component (A) can be measured as a value in terms of polystyrene by gel permeation chromatography (GPC). The weight average molecular weight of the component (A) can be determined by measurement using LC-9A/RID-6A manufactured by Shimadzu Corporation as a measuring apparatus, Shodex K-800P/K-804L/K-804L manufactured by Showa Denko K. K. as columns, and chloroform or the like as a mobile phase, for example. The measurement is performed at a column temperature of 40° C., and the weight average molecular weight can be computed using a calibration curve of standard polystyrene.

The content of the component (A) in the resin composition is not particularly limited so long as the above conditions of $n_a$ and $n_b$ are satisfied, and is, for example, 0.5% by mass or more, 1% by mass or more, 2% by mass or more, or 3% by mass or more, relative to 100% by mass of the resin component in the resin composition. The upper limit of the content of the component (A) is, for example, 90% by mass or less, 85% by mass or less, 80% by mass or less, 70% by mass or less, 65% by mass or less, 60% by mass or less, or 50% by mass or less.

(B) Resin having Radical Polymerizable Functional Group FB

The resin composition of the present invention contains the resin having the radical polymerizable functional group FB as the component (B). The cured product has the molecular structure moiety formed by the reaction of the radical polymerizable functional group FB of the component (B) and the functional group FB' of the component (C), thereby reducing the polarity of the cured product and reducing the value of dielectric tangent.

The radical polymerizable functional group FB is preferably an ethylenic unsaturated group having a carbon-carbon double bond. The ethylenic unsaturated group is preferably one or more groups selected from the group consisting of an acrylic group, a methacrylic group, a styryl group, an olefin group, and a maleimide group. Preferred examples of the olefin group include an allyl group, a vinyl group, and a propenyl group. Consequently, in a preferred embodiment, the radical polymerizable functional group FB is one or more selected from the group consisting of an acrylic group, a methacrylic group, a styryl group, an allyl group, a vinyl group, a propenyl group, and a maleimide group. The component (B) may have one or two or more radical polymerizable functional groups FB.

The component (B) refers to a resin that has the radical polymerizable functional group FB and does not have any thermosetting functional groups such as the functional group FA described above and the functional group FA' described below.

Preferred examples of the component (B) include a compound represented by Formula (B1) below, a compound represented by Formula (B6) below, a compound represented by Formula (B7) below, a compound represented by Formula (B9) below, and a compound represented by Formula (B10) below. The component (B) may also be a benzocyclobutene resin.

[Chem. 1]

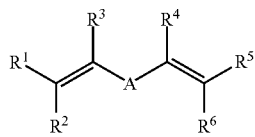
(B1)

In Formula (B1), $R^1$ to $R^6$ each independently represent a hydrogen atom or a $C_{1-4}$ alkyl group and preferably represent a hydrogen atom. In Formula (B1), A represents a divalent group represented by Formula (B2) below or Formula (B3) below.

[Chem. 2]

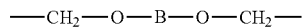
(B2)

In Formula (B2), B represents a divalent group represented by Formula (B2-1), (B2-2), or (B2-3) below.

[Chem. 3]

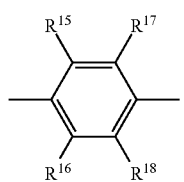
(B2-1)

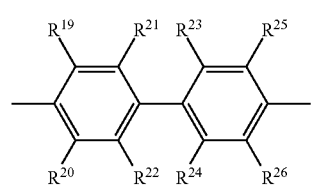
(B2-2)

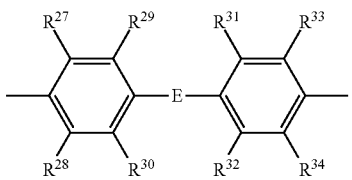
(B2-3)

In Formula (B2-1), $R^{15}$ to $R^{18}$ each independently represent a hydrogen atom, an alkyl group with a carbon atom number of six or less, or a phenyl group and preferably represent a hydrogen atom or a methyl group.

In Formula (B2-2), $R^{19}$ to $R^{26}$ each independently represent a hydrogen atom, an alkyl group with a carbon atom number of six or less, or a phenyl group and preferably represent a hydrogen atom or a methyl group.

In Formula (B2-3), $R^{27}$ to $R^{34}$ each independently represent a hydrogen atom, an alkyl group with a carbon atom number of six or less, or a phenyl group and preferably represent a hydrogen atom or a methyl group. In Formula (B2-3), E represents a linear, branched, or cyclic divalent hydrocarbon group with a carbon atom number of 20 or less.

[Chem. 4]

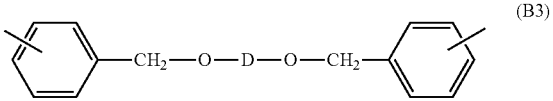
(B3)

In Formula (B3), D represents a divalent group represented by Formula (B4) below.

[Chem. 5]

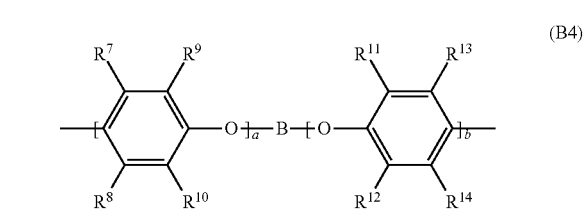
(B4)

In Formula (B4), $R^7$ to $R^{14}$ each independently represent a hydrogen atom, an alkyl group with a carbon atom number of six or less, or a phenyl group and preferably represent a hydrogen atom or a methyl group. In particular, $R^7$, $R^8$, $R^{13}$ and $R^{14}$ each more preferably represent a methyl group. In Formula (B4), a and b are integers of 0 or more and 100 or less in which at least one of them is not zero. In Formula (B4), B represents a divalent group represented by Formula (B2-1), (B2-2), or (B2-3) above.

The compound represented by Formula (B1) above is preferably a compound represented by Formula (B5) below.

[Chem. 6]

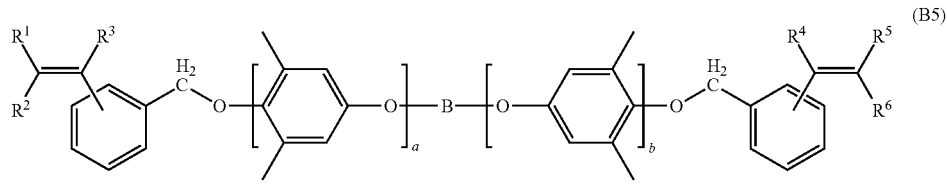

In Formula (B5), $R^1$ to $R^6$ have the same meaning as that of $R^1$ to $R^6$ in Formula (B1) above, B has the same meaning as that of B in Formula (B2) above, and a and b have the same meaning as that of a and b in Formula (B4) above.

[Chem. 7]

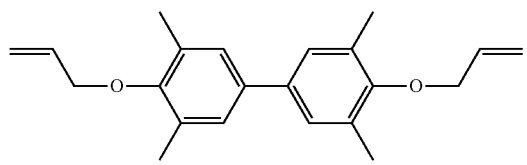

[Chem. 8]

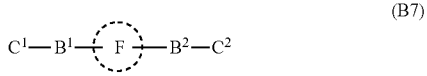

In Formula (B7), the ring F represents a divalent group having a cyclic ether structure with a five or more-membered ring.

The cyclic ether structure may have a monocyclic structure including only one ring, have a polycyclic structure including two or more rings, or have a condensed ring structure including a condensed ring.

In view of markedly obtaining the desired effects of the present invention, the number of oxygen atoms included in one cyclic ether structure is preferably one or more, more preferably two or more, and preferably five or less, more preferably four or less, and even more preferably three or less.

The cyclic ether structure is preferably a five to ten-membered ring, more preferably a five to eight-membered ring, and even more preferably a five to six-membered ring. Specific examples of the cyclic ether structure with a five or more-membered ring include a furan structure, a tetrahydrofuran structure, a dioxolan structure, a pyran structure, a dihydropyran structure, a tetrahydropyran structure, and a dioxane structure. Among these, in view of improving the compatibility of the resin composition, a dioxane structure is preferred. The dioxane structure includes a 1,2-dioxane structure, a 1,3-dioxane structure, and a 1,4-dioxane structure; and a 1,3-dioxane structure is preferred.

The cyclic ether structure may have a substituent. The type of the substituent is not particularly limited, and may be any of the substituents described above. Examples thereof include an alkyl group and an alkoxy group. The carbon atom number of the substituent is as described above, and is preferably one to six, and more preferably one to three.

Examples of the divalent group having a cyclic ether structure with a five or more-membered ring include a furan-2,5-diyl group, a tetrahydrofuran-2,5-diyl group, a dioxolan-2,5-diyl group, a pyran-2,5-diyl group, a dihydropyran-2,5-diyl group, a tetrahydropyran-2,5-diyl group, a 1,2-dioxane-3,6-diyl group, a 1,3-dioxane-2,5-diyl group, a 1,4-dioxane-2,5-diyl group, and a 5-ethyl-1,3-dioxane-2,5-diyl group. Among these, a 5-ethyl-1,3-dioxane-2,5-diyl group is preferable.

In Formula (B7), $B^1$ and $B^2$ each independently represent a single bond or a divalent coupling group. $B^1$ and $B^2$ are each preferably a divalent coupling group. Examples of the divalent coupling group include an alkylene group optionally having a substituent, an alkenylene group optionally having a substituent, an alkynylene group optionally having a substituent, an arylene group optionally having a substituent, heteroarylene group optionally having a substituent, a group represented by —COO—, a group represented by —CO—, a group represented by —CONH—, a group represented by —NHCONH—, a group represented by —NHCOO—, a group represented by —C(=O)—, a group represented by —S—, a group represented by —SO—, a group represented by —NH—, and a group in which a plurality of these groups are combined.

Among these, $B^1$ and $B^2$ are each preferably a group obtained by combining two or more groups selected from the group consisting of an alkylene group optionally having a substituent, an alkenylene group optionally having a substituent, an alkynylene group optionally having a substituent, a group represented by —COO—, and a group represented by —O—. In particular, $B^1$ and $B^2$ are each more preferably a group obtained by combining two or more groups selected from the group consisting of an alkylene group optionally having a substituent, and a group represented by —COO—.

In Formula (B7), $C^1$ and $C^2$ each independently represent a functional group. Examples of the functional group include a vinyl group, a methacrylic group, an acrylic group, an allyl group, a styryl group, a propenyl group, and an epoxy group. In a preferred embodiment, $C^1$ and $C^2$ are each a vinyl group.

Specific examples of the compound represented by Formula (B7) include a compound represented by Formula (B8) below.

[Chem. 9]

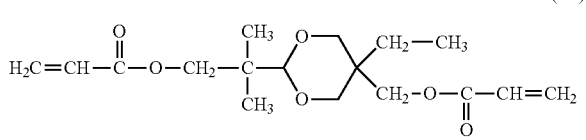

-continued

[Chem. 10]

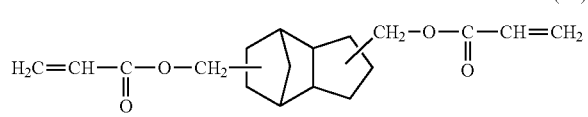
(B9)

[Chem. 11]

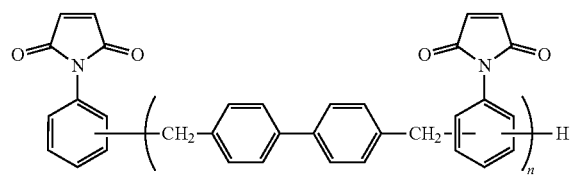
(B10)

In Formula (B10), n represents 1 to 5.

Examples of the component (B) include "OPE-2St 1200" (a styrene-modified polyphenylene ether resin with a radical polymerizable functional group equivalent of 630 g/eq and a number average molecular weight of 1,200, corresponding to Formula (B5) above) manufactured by Mitsubishi Gas Chemical Company, Inc., "YL7776" (a bixylenol diallyl ether resin with a radical polymerizable functional group equivalent of 165.5 g/eq and a number average molecular weight of 331, corresponding to Formula (B6) above) manufactured by Mitsubishi Chemical Corporation, "A-DOG" (dioxane acrylic monomer glycol diacrylate with a radical polymerizable functional group equivalent of 163 g/eq and a number average molecular weight of 326, corresponding to Formula (B8) above) manufactured by Shin-Nakamura Chemical Co., Ltd., "KAYARAD R-604" (corresponding to Formula (B8) above) manufactured by Nippon Kayaku Co., Ltd., "A-DCP" (tricyclodecane dimethanol diacrylate with a radical polymerizable functional group equivalent of 152 g/eq and a number average molecular weight of 304, corresponding to Formula (B9) above) manufactured by Shin-Nakamura Chemical Co., Ltd., and "MIR-3000-70MT" (with a radical polymerizable functional group equivalent of 275 g/eq, corresponding to Formula (B10) above) manufactured by Nippon Kayaku Co., Ltd. The component (B) may be used singly or in combination of two or more thereof.

The number average molecular weight of the component (B) is preferably 100 or more, more preferably 200 or more, and preferably 10,000 or less, more preferably 3,000 or less. The number average molecular weight of the component (B) being in the above range can inhibit volatilization during the drying of resin varnish and inhibit the melt viscosity of the resin composition from excessively increasing. The number average molecular weight can be measured as a value in terms of polystyrene by gel permeation chromatography (GPC). The measurement of the number average molecular weight by GPC can be performed using LC-9A/RID-6A manufactured by Shimadzu Corporation as a measuring apparatus, using Shodex K-800P/K-804L/K-804L manufactured by Showa Denko K. K. as columns, and using chloroform as a mobile phase at a column temperature of 40° C., for example.

In view of achieving a resin composition providing a cured product of low polarity and low dielectric tangent, the radical polymerizable functional group FB equivalent of the component (B) is preferably 5,000 or less, more preferably 3,000 or less, and even more preferably 2,000 or less, or 1,000 or less. The lower limit of the radical polymerizable functional group FB equivalent is not particularly limited so long as the effects of the present invention are produced, and may be 50 or more, 80 or more, or 100 or more.

The content of the component (B) in the resin composition is not particularly limited so long as the above conditions of $n_a$ and $n_b$ are satisfied, and is, for example, 0.1% by mass or more, 0.5% by mass or more, 1% by mass or more, 3% by mass or more, or 5% by mass or more, relative to 100% by mass of the resin component in the resin composition. The upper limit of the content of the component (B) is 40% by mass or less, 35% by mass or less, 30% by mass or less, or 25% by mass or less, for example.

(C) Resin having Functional Group FA' Reacting with Thermosetting Functional Group FA and Functional Group FB' Reacting with Radical Polymerizable Functional Group FB The resin composition of the present invention contains the resin having the functional group FA' reacting with the thermosetting functional group FA and the functional group FB' reacting with the radical polymerizable functional group FB as the component (C). The component (C) reacts with both the component (A) and the component (B) to form the cured product. The cured product has the molecular structure moiety formed by the reaction of the thermosetting functional group FA of the component (A) and the functional group FA' of the component (C), thereby providing a cured product of dense structure, high mechanical strength, and excellent adhesiveness. The cured product has the molecular structure moiety formed by the reaction of the radical polymerizable functional group FB of the component (B) and the functional group FB' of the component (C), thereby reducing the polarity of the cured product and reducing the value of dielectric tangent.

Conventionally, use of two resins differing in reactivity in combination resulted in bad miscibility of the resins, and thus it has been difficult to form uniform cured products. Consequently, it has been difficult to achieve the above effects simultaneously at a high level. In contrast, in the resin composition of the present invention, the component (C) has sites, within the same compound, capable of reacting with each of the two resins differing in reactivity. Thus, the component (C) links the resins together to form a cured product and can form a uniform cured product. Accordingly, the above features can be produced simultaneously at a high level, and the desired effects of the present invention can be achieved. Furthermore, using the component (C) can improve miscibility of components including the component (A) and the component (B). Consequently, composition uniformity of the cured product can be improved, and thus the above effects can be obtained at a higher level.

The functional group FA' of the component (C) is not particularly limited so long as it can react with the thermosetting functional group FA of the component (A), and examples thereof include an epoxy group, a phenolic hydroxy group, a benzoxazine group, a cyanate ester group, an active ester group, a carbodiimide group, an acid anhydride group, an oxetanyl group, an episulfide group, an isocyanate group, and an amino group. The component (C) may have one or two or more functional groups FA'.

When the thermosetting functional group FA is an epoxy group, the functional group FA' may be an epoxy group, a phenolic hydroxy group, an active ester group, or an amino group.

When the thermosetting functional group FA is an active ester group, the functional group FA' may be an epoxy group or a carbodiimide group.

When the thermosetting functional group FA is a phenolic hydroxy group, the functional group FA' may be an epoxy group or a phenolic hydroxy group.

When thermosetting functional group FA is a carbodiimide group, the functional group FA' may be an epoxy group or an active ester group.

Although the combination of the thermosetting functional group FA and the functional group FA' is not limited to a particular combination so long as they can react with each other, at least one of the thermosetting functional group FA and the functional group FA' is preferably an epoxy group, an episulfide group, or an oxetanyl group, and more preferably an epoxy group.

Although the functional group FB' of the component (C) is not particularly limited so long as it can react with the radical polymerizable functional group FB of the component (B), it is preferably an ethylenic unsaturated group having a carbon-carbon double bond. The ethylenic unsaturated group is preferably one or more groups selected from the group consisting of an acrylic group, a methacrylic group, a styryl group, an olefin group, and a maleimide group. As described above, preferred examples of the olefin group include an allyl group, a vinyl group, and a propenyl group. Consequently, in a preferred embodiment, the functional group FB' is one or more selected from the group consisting of an acrylic group, a methacrylic group, a styryl group, an allyl group, a vinyl group, a propenyl group, and a maleimide group. The component (C) may have one or two or more functional groups FB'.

Preferred examples of the component (C) include a compound represented by Formula (C1) below, a compound represented by Formula (C2) below, a compound represented by Formula (C3) below, and a compound represented by Formula (C4) below.

[Chem. 12]

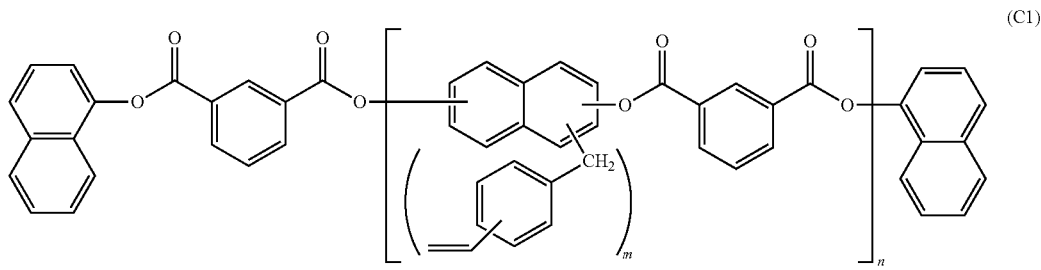

(C1)

In Formula (C1), m represents an integer of 1 to 6, and n represents an integer of 1 to 20.

In Formula C1), m is preferably an integer of 1 to 6, and more preferably an integer of 1 to 3, and n is preferably an integer of 1 to 10, more preferably an integer of 1 to 5, and particularly preferably an integer of 1 to 3. Being within the value ranges allows the component (C) to react with the component (B) at an appropriate ratio and can achieve a reduction in dielectric tangent.

The component (C) may be a mixture of compounds having different values of m and n in Formula C1). The component (C) may contain a compound with n being 0 in Formula C1) (a compound represented by Formula (0-1) below) and a compound with n being an integer of 1 to 20 and m being 0 (a compound represented by Formula (0-2) below) so long as it contains the compound represented by Formula C1).

When the entire component (C) is defined as 100% by mass, the proportion of the sum of the compound represented by Formula (0-1) and the compound represented by Formula (0-2) is preferably 10% by mass or less, more preferably 5% by mass or less, even more preferably 3% by mass or less, and particularly preferably 1% by mass or less, or 0% by mass. Being in the range allows the component (C) to react with the component (B) at an appropriate ratio and can achieve a reduction in dielectric tangent.

[Chem. 13]

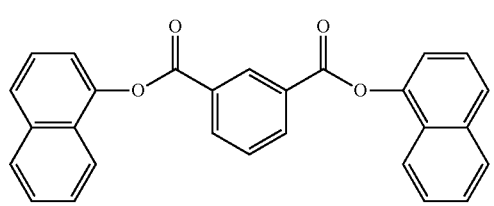

(0-1)

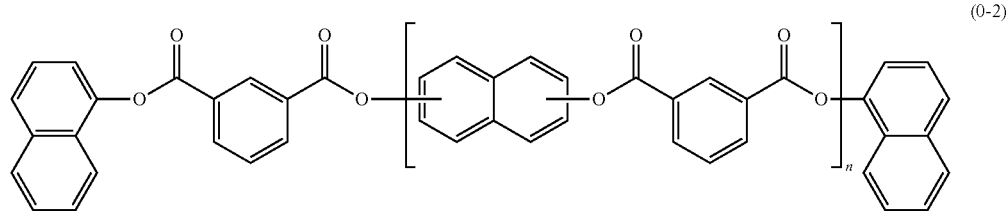

In Formula (0-2), n represents an integer of 1 to 20.

[Chem. 14]

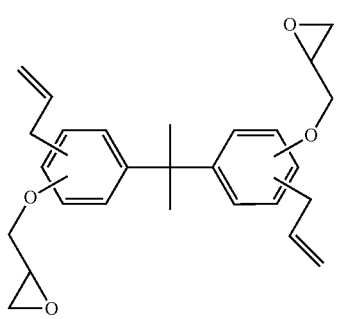

(C2)

[Chem. 15]

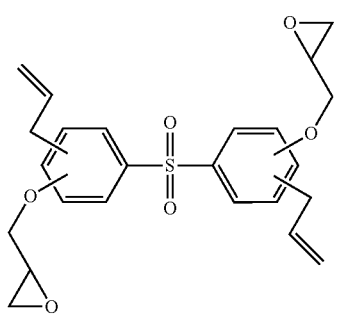

(C3)

[Chem. 16]

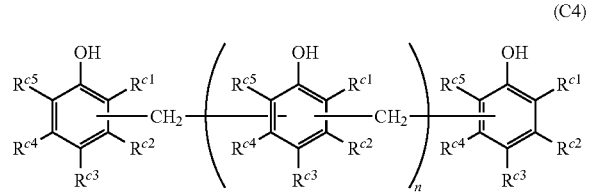

(C4)

In Formula (C4), n is 0 to 3, $R^{c1}$ to $R^{c5}$ each independently represent a hydrogen atom or an allyl group. At least one of $R^{c1}$ to $R^{c5}$ in Formula (C4) is an allyl group.

Examples of the component (C) include "PC1300-02-65MA" (with an active ester group equivalent of 199 g/eq and a vinyl group equivalent of 1,400 g/eq, corresponding to Formula C1) above) manufactured by Air Water Inc., "RE-810NM" (with an epoxy group equivalent of 221 g/eq and an allyl group equivalent of 221 g/eq, corresponding to Formula (C2) above) manufactured by Nippon Kayaku Co., Ltd., "RE-820" (with an epoxy group equivalent of 228 g/eq and an allyl group equivalent of 228 g/eq, corresponding to Formula (C3) above) manufactured by Nippon Kayaku Co., Ltd., and "MEH-8000H" (with a phenolic hydroxy group equivalent of 140 g/eq and an allyl group equivalent of 140 g/eq, corresponding to Formula (C4) above) manufactured by Meiwa Plastic Industries, Ltd.

In view of making the cross-linking density of a cured product sufficient and achieving a resin composition providing a cured product of excellent mechanical strength and adhesiveness, the functional group FA' equivalent of the component (C) is preferably 5,000 or less, more preferably 3,000 or less, and even more preferably 2,000 or less or 1,000 or less. The lower limit of the functional group FA' equivalent is not particularly limited so long as the effects of the present invention are produced, and may be 50 or more, 80 or more, or 100 or more.

In view of achieving a resin composition providing a cured product of low polarity and low dielectric tangent, the functional group FB' equivalent of the component (C) is preferably 5,000 or less, more preferably 3,000 or less, and even more preferably 2,000 or less or 1,500 or less. The lower limit of the functional group FB' equivalent is not particularly limited so long as the effects of the present invention are produced, may be 50 or more, 80 or more, or 100 or more.

The content of the component (C) in the resin composition is not particularly limited so long as the above conditions of $n_a$ and $n_b$ are satisfied, and is, for example, 1% by mass or more, 2% by mass or more, 3% by mass or more, 5% by mass or more, or 10% by mass or more, relative to 100% by mass of the resin component in the resin composition. The upper limit of the content of the component (C) is 99% by mass or less, 98% by mass or less, 95% by mass or less, 90% by mass or less, or 80% by mass or less, for example.

In view of achieving a resin composition providing a cured product of excellent dielectric tangent, mechanical strength, and adhesiveness, the total content of the component (A), the component (B) and the component (C) is preferably 10% by mass or more, more preferably 20% by mass or more, and even more preferably 30% by mass or more when the non-volatile component in the resin composition is defined as 100% by mass. The upper limit of the total content is not particularly limited, and may be generally 95% by mass or less, 90% by mass or less, 80% by mass or less, or 70% by mass or less.

(D) Inorganic Filler

The resin composition of the present invention may further contain an inorganic filler as the component (D). Containing the inorganic filler can achieve a cured product of lower coefficient of linear thermal expansion and lower dielectric tangent.

The material of the component (D) is not particularly limited; and examples thereof include silica, alumina, glass, cordierite, silicone oxides, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, barium titanate, strontium titanate, calcium titanate, magnesium titanate, bismuth titanate, titanium oxide, zirconium oxide, barium titanate zirconate, barium zirconate, calcium zirconate, zirconium phosphate, and zirconium phosphate tungstate. Among these, preferred is silica, and more preferred are amorphous silica, crushed silica, fused silica, crystalline silica, synthetic silica, hollow silica, and spherical silica. In view of reducing the surface roughness of an insulating layer, fused silica and spherical silica are even more preferred, and spherical fused silica is particularly preferred. The component (D) may be used singly or in combination with two or more thereof.

The component (D) is normally contained in the resin composition in particulate form. The average particle diameter of the component (D) is preferably 5 μm or less, more preferably 3 μm or less, even more preferably 2 μm or less, and particularly preferably 1 μm or less, 0.8 μm or less, 0.6 μm or less, or 0.4 μm or less. The lower limit of the average particle diameter is preferably 0.01 μm or more, more preferably 0.03 μm or more, even more preferably 0.05 μm or more, and particularly preferably 0.07 μm or more or 0.1 μm or more. Examples of commercially available products of the component (D) include "SP60-05" and "SP507-05" manufactured by Nippon Steel & Sumikin Materials Co., Ltd.; "YC100C", "YA050C", "YA050C-MJE", and "YA010C" manufactured by Admatechs Company Limited; "UFP-30" manufactured by Denka Company Limited; "Silfil NSS-3N", "Silfil NSS-4N", and "Silfil NSS-5N" manufactured by Tokuyama Corporation; and "SC2500SQ", "SO-C4", "SO-C2", and "SO-C1" manufactured by Admatechs Company Limited.

The average particle diameter of the particles of the component (D) and the like can be measured by a laser diffraction/scattering method on the basis of the Mie scattering theory. Specifically, the particle size distribution of the particles is measured on the basis of volume, and a median diameter thereof can be measured as an average particle diameter using a laser diffraction/scattering particle size distribution measuring device. For a measurement sample, a dispersion in which the particles are dispersed in water by ultrasonication can be preferably used. For the laser diffraction/scattering particle size distribution measuring apparatus, "LA-960" manufactured by Horiba, Ltd. or the like can be used.

In view of markedly obtaining the effects of the present invention, a specific surface area of the inorganic filler is preferably 1 $m^2/g$ or more, more preferably 2 $m^2/g$ or more, particularly preferably 5 $m^2/g$ or more. The upper limit thereof is not particularly limited, and is preferably 60 $m^2/g$ or less, 50 $m^2/g$ or less, or 40 $m^2/g$ or less. The specific surface area of the inorganic filler can be measured by a BET method.

The component (D) may be subjected to surface treatment with any surface treatment agent. Examples of the surface treatment agent include aminosilane-based coupling agents, epoxysilane-based coupling agents, mercaptosilane-based coupling agents, alkoxysilane-based coupling agents, organosilazane compounds, and titanate-based coupling agents. The surface treatment of the component (D) using these surface treatment agents can increase the humidity resistance and dispersibility of the component (D).

Examples of commercially available products of the surface treatment agent include "KBM-22" (dimethyldimethoxysilane) manufactured by Shin-Etsu Chemical Co., Ltd., "KBM-403" (3-glycidoxypropyltrimethoxysilane) manufactured by Shin-Etsu Chemical Co., Ltd., "KBM-803" (3-mercaptopropyltrimethoxysilane) manufactured by Shin-Etsu Chemical Co., Ltd., "KBE-903" (3-aminopropyltriethoxysilane) manufactured by Shin-Etsu Chemical Co., Ltd., "KBM-573" (N-phenyl-3-aminopropyltrimethoxysilane) manufactured by Shin-Etsu Chemical Co., Ltd., "SZ-31" (hexamethyldisilazane) manufactured by Shin-Etsu Chemical Co., Ltd., "KBM-103" (phenyltrimethoxysilane) manufactured by Shin-Etsu Chemical Co., Ltd., and "KBM-4803" (a long-chain epoxy type silane coupling agent) manufactured by Shin-Etsu Chemical Co., Ltd. The surface treatment agent may be used singly or in combination of two or more thereof at any ratio.

The degree of surface treatment with the surface treatment agent can be evaluated by a carbon amount per unit surface area of the component (D). In view of improving the dispersibility of the component (D), the carbon amount per unit surface area of the component (D) is preferably 0.02 $mg/m^2$ or more, more preferably 0.1 $mg/m^2$ or more, and particularly preferably 0.2 $mg/m^2$ or more. In view of inhibiting an increase in the melt viscosity of the resin composition and melt viscosity in a sheet form, the carbon amount is preferably 1 $mg/m^2$ or less, more preferably 0.8 $mg/m^2$ or less, and particularly preferably 0.5 $mg/m^2$ or less.

The carbon amount per unit surface area of the component (D) can be measured after the surface-treated component (D) is washed with a solvent (e.g., methyl ethyl ketone (hereinafter, may be abbreviated as "MEK")). Specifically, a sufficient amount of methyl ethyl ketone and the component (D) subjected to surface treatment with the surface treatment agent are mixed together and the resultant mixture is washed by ultrasonication at 25° C. for 5 minutes. A supernatant liquid is removed and a solid content is dried. The carbon amount per unit surface area of the component (D) can be measured using a carbon analyzer. For the carbon analyzer, "EMIR-320V" manufactured by Horiba, Ltd. can be used.

In view of obtaining a cured product of low coefficient of linear thermal expansion and low dielectric tangent, the content of the component (D) in the resin composition is preferably 50% by mass or more, more preferably 55% by mass or more, 60% by mass or more, 65% by mass or more, or 70% by mass or more when the non-volatile component in the resin composition is defined as 100% by mass. In view of the mechanical strength of the cured product to be obtained, the upper limit of the content of the component (D) is preferably 90% by mass or less, more preferably 85% by mass or less, and even more preferably 80% by mass or less.

The resin composition of the present invention may further contain one or more additives selected from the group consisting of a curing accelerator, a thermoplastic resin, a flame retardant, and an organic filler as needed.

Curing Accelerator

The resin composition of the present invention may further contain the curing accelerator. Examples of the curing accelerator include amine-based curing accelerators, imidazole-based curing accelerators, guanidine-based curing accelerators, metal-based curing accelerators, and peroxide-based curing accelerators. Among these, preferred are amine-based curing accelerators, imidazole-based curing accelerators, and peroxide-based curing accelerators. The curing accelerator may be used singly or in combination of two or more thereof. When using the curing accelerator, the content of the curing accelerator in the resin composition is preferably in a range of 0.01% by mass to 3% by mass relative to 100% by mass of the resin component in the resin composition, in view of markedly obtaining the desired effects of the present invention.

Thermoplastic Resin

The resin composition of the present invention may further contain the thermoplastic resin. Examples of the thermoplastic resin include a phenoxy resin, a polyvinyl acetal resin, a polyolefin resin, a polybutadiene resin, a polyimide resin, a polyamideimide resin, a polyetherimide resin, a polysulfone resin, a polyethersulfone resin, a polyphenylene ether resin, a polycarbonate resin, a polyether ether ketone resin, a polyester resin, and an indene coumarone resin. The thermoplastic resin may be used singly or in combination of two or more thereof.

The polystyrene-equivalent weight average molecular weight of the thermoplastic resin is preferably in a range of 8,000 to 70,000, more preferably in a range of 10,000 to 60,000, and even more preferably in a range of 20,000 to 60,000. The polystyrene-equivalent weight average molecular weight the thermoplastic resin is measured by gel permeation chromatography (GPC). The polystyrene-equivalent weight average molecular weight the thermoplastic resin can be determined by measurement using LC-9A/RID-6A manufactured by Shimadzu Corporation as a measuring apparatus, Shodex K-800P/K-804L/K-804L manufactured by Showa Denko K. K. as columns, and chloroform or the like as a mobile phase. The measurement is performed at a column temperature of 40° C., and the polystyrene-equivalent weight average molecular weight can be computed using a calibration curve of standard polystyrene.

Examples of the phenoxy resin include phenoxy resins having one or more skeletons selected from the group consisting of a bisphenol A skeleton, a bisphenol F skeleton, a bisphenol S skeleton, a bisphenol acetophenone skeleton, a novolak skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. A terminal ends of the phenoxy resin may be any functional group such as a phenolic hydroxy group or an epoxy group. The phenoxy resin may be used singly or in combination of two or more thereof at any ratio.

Examples of the phenoxy resin include "1256" and "4250" (bisphenol A skeleton-containing phenoxy resins) manufactured by Mitsubishi Chemical Corporation; "YX8100" (a bisphenol S skeleton-containing phenoxy resin) manufactured by Mitsubishi Chemical Corporation; "YX6954" (a bisphenol acetophenone skeleton-containing phenoxy resin) manufactured by Mitsubishi Chemical Corporation; "FX280" and "FX293" manufactured by Nippon Steel & Sumikin Chemical Co., Ltd.; and "YX6954BH30", "YX7553", "YX7553BH30", "YL7769BH30", "YL6794", "YL7213", "YL7290", "YL7891BH30", and "YL7482" manufactured by Mitsubishi Chemical Corporation.

Examples of the indene coumarone resin include "H-100", "WS-100G", "WS-100H", "WS-120V", and "WS-100GC" manufactured by Nitto Chemical Co., Ltd.; and "C10", "C30", and "CA80" manufactured by Rütgers Novares GmbH.

The lower limit of the content of the thermoplastic resin in the resin composition is preferably 0.1% by mass or more and more preferably 0.5% by mass or more, relative to 100% by mass of the resin component in the resin composition. The upper limit thereof is preferably 10% by mass or less and more preferably 5% by mass or less. Being in the range produces effects of film formability and improvement in mechanical strength and can further reduce an increase of melt viscosity and the roughness of an insulating layer surface after a wet roughening process.

Flame Retardant

The resin composition of the present invention may further contain the flame retardant. Examples of the flame retardant include organic phosphate-based flame retardants, organic nitrogen-containing phosphorous compounds, nitrogen compounds, silicone-based flame retardants, and metal hydroxides. The flame retardant may be used singly or in combination of two or more thereof. When using the flame retardant, the content of the flame retardant in the resin composition is not particularly limited, and is preferably in a range of 0.5% by mass to 20% by mass, more preferably in a range of 0.5% by mass to 15% by mass, and even more preferably in a range of 0.5% by mass to 10% by mass, relative to 100% by mass of the resin component in the resin composition.

Organic Filler

The resin composition of the present invention may further contain the organic filler. For the organic filler, any organic filler that can be used for forming an insulating layer of a printed wiring board may be used. Examples thereof include rubber particles, polyamide fine particles, and silicone particles, and rubber particles are preferred.

The rubber particles are not particularly limited so long as they are resin fine particles obtained by performing chemical cross-linking treatment on resins with rubber elasticity to be insoluble and infusible into organic solvents. Examples thereof include acrylonitrile butadiene rubber particles, butadiene rubber particles, and acrylic rubber particles. Specific examples of the rubber particles include XER-91 (manufactured by Japan Synthetic Rubber Co., Ltd.), Staphyloid AC3355, AC3816, AC3816N, AC3832, AC4030, AC3364, and IM101 (manufactured by Aica Kogyo Co., Ltd.), and Paraloid EXL2655 and EXL2602 (manufactured by Kureha Chemical Industries Co., Ltd.).

The average particle diameter of the organic filler is preferably in a range of 0.005 μm to 1 μm and more preferably in a range of 0.2 μm to 0.6 μm. The average particle diameter of the organic filler can be measured using dynamic light scattering. The average particle diameter of the organic filler can be measured by dispersing the organic filler uniformly in an appropriate organic solvent by ultrasonication or the like, preparing the particle size distribution of the organic filler using a concentrated system particle size analyzer ("FPAR-1000" manufactured by Otsuka Electronics Co., Ltd.) on a mass basis, and defining its median diameter as the average diameter, for example. When using the organic filler, the content of the organic filler in the resin composition is preferably 1% by mass to 10% by mass and more preferably 2% by mass to 5% by mass when the non-volatile component in the resin composition is defined as 100% by mass.

The resin composition of the present invention may contain other components as needed. Examples of the other components include organic metal compounds such as organic copper compounds, organic zinc compounds, and organic cobalt compounds; and resin additives such as thickeners, antifoaming agents, leveling agents, adhesiveness imparting agents, and colorants.

A method for preparing the resin composition of the present invention is not particularly limited, and examples thereof include a method of mixing and dispersing ingredients using a rotary mixer or the like, with a solvent and the like as needed.

The resin composition of the present invention can provide a cured product of low dielectric tangent. The dielectric tangent of the cured product of the resin composition of the present invention can be measured by a method described in <Measurement of Dielectric Tangent and Mechanical Characteristics (Elongation)> described below. Specifically, the dielectric tangent of the cured product of the resin composition of the present invention can be measured by the cavity resonance perturbation method at a frequency of 5.8 GHz and at a measurement temperature of 23° C. In view of preventing heat generation at high frequency and reducing signal delay and signal noise, the dielectric tangent is preferably lower than 0.0058. The lower limit of the dielectric tangent is preferably as low as possible, and may be generally 0.001 or more or the like.

The resin composition of the present invention can provide a cured product of high mechanical strength. The extension at breaking point (elongation at break) of the cured product of the resin composition of the present invention can be measured by a method described in <Measurement of Dielectric Tangent and Mechanical Characteristics (Elongation)> described below. The elongation at break is preferably 1.6% or longer. The upper limit thereof is not particularly limited, and may be 10% or shorter or the like.

The resin composition of the present invention can provide a cured product of excellent adhesiveness with a conductive layer (adhesiveness with copper foil). The adhesiveness with copper foil of the cured product of the resin composition of the present invention can be measured by a method described in <Measurement of Adhesiveness with Copper Foil> described below. The adhesiveness with copper foil of the cured product to be obtained is preferably 0.40 kgf/cm or more, and more preferably 0.45 kgf/cm or more, or 0.50 kgf/cm or more. The upper limit of the adhesiveness with copper foil is not particularly limited, and may be generally 1.2 kgf/cm or less or the like.

The resin composition of the present invention can provide a cured product exhibiting less degradation of adhesiveness with copper foil under a high-temperature and high-humidity environment. The cured product to be obtained shows high adhesiveness with copper foil even after an accelerated environmental test maintained for 100 hours under conditions of 130° C. and 85% RH. The adhesiveness with copper foil after the accelerated environmental test is preferably 0.25 kgf/cm or more. The upper limit of the adhesiveness with copper foil is not particularly limited, and may be generally 1.2 kgf/cm or less or the like.

The resin composition of the present invention can provide a cured product of low dielectric tangent, high mechanical strength, and high adhesiveness. Consequently, the resin composition of the present invention can be suitably used as a resin composition for forming an insulating layer where a conductive layer (including a redistribution layer) is to be formed in contact with the insulating layer (a resin composition for an insulating layer on which a conductive layer is formed). The resin composition of the present invention can be suitably used as a resin composition for forming an insulating layer of a printed wiring board (a resin composition for an insulating layer of a printed wiring board) and can be more suitably used as a resin composition for forming an internal insulating layer of a printed wiring board (a resin composition for an internal insulating layer of a printed wiring board). The resin composition of the present invention can be suitably used as a resin composition for embedding a semiconductor component in a semiconductor package or embedding components in a component-embedded circuit board (a resin composition for embedding components). The resin composition of the present invention can also be used for a wide range of uses in which resin compositions are required such as sheet-shaped laminated materials such as an adhesive film and a prepreg, solder resist, underfill materials, die bonding materials, and hole-filling resins.

Sheet-Shaped Laminated Material

Although the resin composition of the present invention can be used by applying it in a varnish form, industrially in general, it is suitably used in the form of a sheet-shaped laminated material containing the resin composition.

The sheet-shaped material is preferably an adhesive film and a prepreg described below.

In an embodiment, the adhesive film includes a support and a resin composition layer (an adhesive layer) being in contact with the support, and the resin composition layer (the adhesive layer) is formed of the resin composition of the present invention.

In view of thinning the printed wiring board, the thickness of the resin composition layer is preferably 100 μm or less, more preferably 80 μm or less, and even more preferably 60 μm or less or 50 μm or less. The lower limit of the thickness of the resin composition layer is not particularly limited, and may be generally 1 μm or more, or 5 μm or more or the like.

Examples of the support include films of a plastic material, a metal foil, and a release paper. The film of a plastic material and a metal foil are preferable.

When the film of a plastic material is used as the support, examples of the plastic material include polyesters such as polyethylene terephthalate (PET) and polyethylene naphthalate (PEN), polycarbonate (PC), acryls such as polymethyl methacrylate (PMMA), cyclic polyolefins, triacetyl cellulose (TAC), polyether sulfide (PES), polyether ketone, and polyimide. Among these, polyethylene terephthalate and polyethylene naphthalate are preferable, and polyethylene terephthalate is particularly preferable since it is inexpensive.

When a metal foil is used as the support, examples of the metal foil include a copper foil and an aluminum foil. The copper foil is preferable. For the copper foil, a foil made of single metal of copper may be used. Alternatively, a foil made of an alloy of copper and another metal (e.g., tin, chromium, silver, magnesium, nickel, zirconium, silicon, or titanium) may be used.

A surface of the support which is to be in contact with the resin composition layer may be subjected to a mat treatment or a corona treatment. For the support, a support with a release layer which has a release layer on a surface to be in contact with the resin composition layer may be used. Examples of a release agent used for the release layer of the support with a release layer may include one or more release agents selected from the group consisting of an alkyd resin, a polyolefin resin, a urethane resin, and a silicone resin. Examples of commercially available products of the release agent include "SK-1", "AL-5", and "AL-7" manufactured by Lintec Corporation, which are alkyd resin-based release agents.

The thickness of the support is not particularly limited, and is preferably in a range of 5 μm to 75 μm and more preferably in a range of 10 μm to 60 μm. When the support is the support with a release layer, it is preferable that the total thickness of the support with a release layer falls within the above-described range.

The adhesive film can be produced, for example, by preparing a resin varnish in which a resin composition is dissolved in an organic solvent, applying the resin varnish to the support using a die coater or the like, and drying the resin varnish to form the resin composition layer.

Examples of the organic solvent include ketones such as acetone, methyl ethyl ketone (MEK), and cyclohexanone;

acetic acid esters such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; and amide-based solvents such as dimethylformamide, dimethylacetamide (DMAc), and N-methylpyrrolidone. The organic solvent may be used singly or in combination of two or more thereof.

The resin varnish may be dried by a publicly known method such as heating and blowing hot air. Although a drying condition is not particularly limited, the resin varnish is dried so that the content of the organic solvent in the resin composition layer is 10% by mass or less, and preferably 5% by mass or less. When, for example, a resin varnish containing 30% by mass to 60% by mass of organic solvent is used, the resin varnish is dried at 50° C. to 150° C. for 3 minutes to 10 minutes, whereby a resin composition layer can be formed. However, these conditions vary depending on the boiling point of the solvent in the resin varnish.

In the adhesive film, a protection film that is similar to the support can be further laminated onto a surface of the resin composition layer that is not in contact with the support (that is, a surface on a side opposite to the support). The thickness of the protection film is not particularly limited and is, for example, 1 µm to 40 µm. By laminating the protection film, adhesion of dust or the like or occurrence of scratch on the surface of the resin composition layer can be prevented. The adhesive film can be wound into a roll form and stored. When the adhesive film has the protection film, the adhesive film can be used by peeling off the protection film.

In an embodiment, the prepreg is formed by impregnating a sheet-shaped fiber base material with the resin composition of the present invention.

The sheet-shaped fiber base material for use in the prepreg is not particularly limited, and materials usually used as base materials for prepregs such as glass cloth, aramid nonwoven fabrics, and liquid crystal polymer nonwoven fabrics can be used therefor. In view of thinning the printed wiring board, the thickness of the sheet-shaped fiber base material is preferably 50 µm or less, more preferably 40 µm or less, even more preferably 30 µm or less, and still even more preferably 20 µm or less. The lower limit of the thickness of the sheet-shaped fiber base material is not particularly limited, and is generally 10 µm or more.

The prepreg can be manufactured by a known method such as a hot-melt method or a solvent method.

The thickness of the prepreg can be in a range similar to that of the resin composition layer of the adhesive film described above.

The present invention using the resin composition containing the component (A), the component (B) and the component (C) in combination can achieve a sheet-shaped laminated material providing a cured product of low dielectric tangent, high mechanical strength, and favorable adhesiveness with the conductive layer.

Printed Wiring Board

The printed wiring board of the present invention includes an insulating layer formed of the cured product of the resin composition of the present invention.

In an embodiment, the printed wiring board of the present invention can be manufactured by a method including the following steps (I) and (II) using the adhesive film described above:

(I) laminating the adhesive film on an internal layer substrate such that the resin composition layer of the adhesive film is in contact with the internal layer substrate; and (II) thermally curing the resin composition layer to form an insulating layer.

The "internal layer substrate" used in the step (I) refers mainly to: a substrate such as a glass epoxy substrate, a metal substrate, a polyester substrate, a polyimide substrate, a BT resin substrate and a thermosetting polyphenylene ether substrate; and a circuit substrate in which a patterned conductive layer (circuit) is formed on one side or both sides of the above substrate. The "internal layer substrate" in the present invention also includes an internal layer circuit substrate that is an intermediate product on which an insulating layer and/or a conductive layer is further to be formed in the production of a printed wiring board. In a case where the printed wiring board is a component-embedded circuit board, an internal layer substrate including a component embedded therein may be used.

The lamination of the internal layer substrate and the adhesive film can be carried out by, for example, thermal pressing the adhesive film to the internal layer substrate from the support side. Examples of a member used for thermal pressing the adhesive film to the internal layer substrate (hereinafter referred to as a "thermal pressing member") may include a heated metal plate such as a stainless (SUS) flat panel and a heated metal roll (SUS roll). The thermal pressing member is preferably pressed against the adhesive film in a state that an elastic material such as heat resistant rubber intervenes therebetween so as to allowing the adhesive film to sufficiently follow the surface irregularities of the internal layer substrate, instead of directly pressing the thermal pressing member against the adhesive film.

The lamination of the internal layer substrate and the adhesive film may be carried out by a vacuum lamination method. In the vacuum lamination method, the thermal pressing temperature is preferably in a range of 60° C. to 160° C. and more preferably in a range of 80° C. to 140° C., the thermal pressing pressure is preferably in a range of 0.098 MPa to 1.77 MPa and more preferably in a range of 0.29 MPa to 1.47 MPa, and the thermal pressing time is preferably in a range of 20 seconds to 400 seconds and more preferably in a range of 30 seconds to 300 seconds. It is preferable that the lamination is carried out under a reduced pressure condition of 26.7 hPa or less.

The lamination can be carried out by a commercially available vacuum laminator. Examples of the commercially available vacuum laminator may include a vacuum pressure laminator manufactured by MEIKI CO., LTD. and a vacuum applicator manufactured by Nikko Materials Co., Ltd.

After the lamination, the laminated adhesive film may be subjected to a smoothing treatment, for example, by pressing the thermally pressing member from the support side under normal pressure (atmospheric pressure). A pressing condition for the smoothing treatment may be the same as the thermal pressing condition for the lamination described above. In the smoothing treatment, a commercially available vacuum laminator may be used. The laminating and the smoothing treatment may be performed continuously using the commercially available vacuum laminator.

The support may be removed between the step (I) and the step (II) or may be removed after the step (II).

In the step (II), the resin composition layer is thermally cured to form an insulating layer.

The condition for thermal curing of the resin composition layer is not particularly limited. The condition may be a condition that is usually employed in formation of an insulating layer of a printed wiring board.

A condition for thermally curing the resin composition layer varies depending on the type of the resin composition and the like. For example, the curing temperature is in a range of 120° C. to 240° C. (preferably in a range of 150° C. to 220° C. and more preferably in a range of 170° C. to 200° C.) and the curing time is in a range of 5 minutes to 120 minutes (preferably 10 minutes to 100 minutes and more preferably 15 minutes to 90 minutes).

Before thermally curing the resin composition layer, the resin composition layer may be preheated at a temperature lower than the curing temperature. For example, before thermally curing the resin composition layer, the resin composition layer may be preheated at a temperature of 50° C. or more and less than 120° C. (preferably 60° C. or more and 110° C. or less and more preferably 70° C. or more and 100° C. or less) for 5 minutes or more (preferably 5 minutes to 150 minutes and more preferably 15 minutes to 120 minutes).

When a printed wiring board is produced, a step (III) of perforating the insulating layer, a step (IV) of roughening the insulating layer, and a step (V) of forming the conductive layer on a surface of the insulating layer may be further performed. These steps (III) to (V) may be performed by any methods that are known to those skilled in the art in the production of a printed wiring board. When the support is removed after the step (II), removal of the support may be carried out between the step (II) and the step (III), between the step (III) and the step (IV), or between the step (IV) and the step (V).

In another embodiment, the printed wiring board of the present invention can be manufactured using the prepreg described above. A method for manufacture is basically similar to the case in which the adhesive film is used.

The step (III) is a step of perforating the insulating layer, whereby holes such as via holes and through holes can be formed in the insulating layer. The step (III) may be performed using, for example, a drill, laser, or plasma depending on the composition of the resin composition used for forming the insulating layer or the like. The size and shape of the hole may be appropriately determined in accordance with the design of the printed wiring board.

The step (IV) is a step of roughening the insulating layer. The procedure and condition for roughening are not particularly limited, and publicly known procedure and condition that are generally used in formation of an insulating layer of a printed wiring board may be used. The insulating layer may be roughened by a swelling treatment with a swelling solution, a roughening treatment with an oxidant, and a neutralization treatment with a neutralization solution in this order, for example. The swelling solution is not particularly limited, and examples thereof may include an alkaline solution and a surfactant solution. An alkaline solution is preferable. As the alkaline solution, a sodium hydroxide solution and a potassium hydroxide solution are preferable. Examples of a commercially available swelling solution may include "Swelling Dip Securiganth P" and "Swelling Dip Securiganth SBU" available from Atotech Japan K. K. The swelling treatment with the swelling solution is not particularly limited, and for example, can be performed by immersing the insulating layer into the swelling solution at 30° C. to 90° C. for 1 minute to 20 minutes. From the viewpoint of controlling the swelling of resin in the insulating layer to an appropriate level, it is preferable to immerse the insulating layer into the swelling liquid at 40° C. to 80° C. for 5 minutes to 15 minutes. The oxidant is not particularly limited, and examples thereof may include an alkaline permanganate solution in which potassium permanganate or sodium permanganate is dissolved in an aqueous solution of sodium hydroxide. The roughening treatment with the oxidant such as the alkaline permanganate solution is preferably performed by immersing the insulating layer into an oxidant solution that is heated at 60° C. to 80° C. for 10 minutes to 30 minutes. The concentration of permanganate in the alkaline permanganate solution is preferably 5% by mass to 10% by mass. Examples of a commercially available oxidant may include an alkaline permanganate solution such as "Concentrate Compact CP" and "Dosing Solution Securiganth P" available from Atotech Japan K. K. It is preferable that the neutralization solution be an acidic aqueous solution. Examples of a commercially available product may include "Reduction Solution Securiganth P" available from Atotech Japan K. K. The treatment with the neutralization solution may be performed by immersing the insulating layer a surface of which has been roughened with the oxidant solution into the neutralization solution at 30° C. to 80° C. for 5 minutes to 30 minutes. From the viewpoint of workability and the like, a method of immersing the object that has been subjected to the roughening treatment with the oxidizing agent into the neutralizing liquid at 40° C. to 70° C. for 5 minutes to 20 minutes is preferable.

The step (V) is a step of forming a conductive layer.

A conductive material used for the conductive layer is not particularly limited. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or an alloy layer. Examples of the alloy layer may include layers formed of an alloy of two or more metals selected from the above-described group such as a nickel-chromium alloy, a copper-nickel alloy, and a copper-titanium alloy. In particular, from the viewpoints of versatility of formation of the conductive layer, cost, and ease of patterning, the conductive layer is preferably a single metal layer of chromium, nickel, titanium, aluminum, zinc, gold, palladium, silver or copper, or an alloy layer of a nickel-chromium alloy, a copper-nickel alloy or a copper-titanium alloy; more preferably a single metal layer of chromium, nickel, titanium, aluminum, zinc, gold, palladium, silver or copper, or an alloy layer of a nickel-chromium alloy; and further preferably a single metal layer of copper.

The conductive layer may have a single-layer structure or a multi-layer structure in which two or more layers of single metal layer or alloy layer formed of different kinds of metals or alloys are layered. When the conductive layer has a multi-layer structure, it is preferable that a layer in contact with the insulating layer be a single metal layer of chromium, zinc or titanium or an alloy layer of nickel-chromium alloy.

The thickness of the conductive layer varies depending on a desired design of a printed wiring board, and is generally 3 μm to 35 μm, and preferably 5 μm to 30 μm.

In an embodiment, the conductive layer may be formed by plating. For example, a conductive layer having a desired wiring pattern can be formed by plating the surface of the insulating layer through a conventionally known technique such as a semi-additive method and a full-additive method.

In another embodiment, the conductive layer may be formed using a metal foil. When the conductive layer is formed using the metal foil, the step (V) is preferably performed between the step (I) and the step (II). The support is removed after the step (I), and the metal foil is laminated on the exposed surface of the resin composition layer, for example. The lamination of the resin composition layer and the metal foil may be performed by vacuum lamination. The conditions of the lamination may be similar to the conditions described for the step (I). Next, the step (II) is performed to form the insulating layer. Subsequently, using the metal foil on the insulating layer, the conductive layer having a desired wiring pattern can be formed by a known technique such as the subtractive process or the modified semi-additive process.

The metal foil can be manufactured by a known method such as electrolysis or rolling, for example. Examples of commercially available products of the metal foil include HLP Foil and JXUT-III Foil manufactured by JX Nippon Mining & Metals Corporation and 3EC-III Foil and TP-III Foil manufactured by Mitsui Mining & Smelting Co., Ltd.

When the printed wiring board is manufactured using the resin composition of the present invention containing the component (A), the component (B) and the component (C) in combination, an insulating layer of low dielectric tangent, high mechanical strength, and excellent adhesiveness can be achieved.

Semiconductor Package

A semiconductor package of the present invention includes a circuit board, a semiconductor component mounted on the circuit board, and a sealant sealing the semiconductor component, and is characterized in that the sealant is formed of the cured product of the resin composition of the present invention. The structures and the types of the circuit board and the semiconductor component forming the semiconductor package of the present invention are not particularly limited, and any circuit board and semiconductor component usually used for forming the semiconductor package may be used.

The semiconductor package of the present invention can be manufactured by sealing a semiconductor with the resin composition of the present invention. Conditions for sealing the semiconductor are not particularly limited, and any sealing conditions usually used for manufacturing the semiconductor package may be employed.

Semiconductor Device

A semiconductor device of the present invention includes the cured product of the resin composition of the present invention. The semiconductor device of the present invention can be manufactured using the printed wiring board or the semiconductor package of the present invention.

Examples of the semiconductor device include various kinds of semiconductor devices used in electrical products (e.g., computers, cellular phones, digital cameras, and TV sets), transportation (e.g., motorcycles, automobiles, electric trains, ships, and aircraft), and the like.

EXAMPLES

Hereinafter, the present invention will be described more specifically by Examples. The present invention, however, is not limited to these Examples. In the following description, "part" and "%" represent "part by mass" and "% by mass", respectively, unless otherwise specified.

First, there will be described the methods of measuring and evaluating the physical properties in the present specification.

<Measurement of Adhesiveness with Copper Foil>

(1) Surface Treatment of Copper Foil

A glossy surface of electrolytic copper foil ("3EC-III" manufactured by Mitsui Mining & Smelting Co., Ltd. with a thickness of 35 μm) was immersed into a microetching agent ("CZ-8101" manufactured by MEC Co., Ltd.) to perform roughening treatment (Ra value=1 μm) on the copper surface, followed by subjecting to rustproofing treatment using a rustproofing solution ("CL8300" manufactured by MEC Co., Ltd.). The obtained copper foil is referred to as CZ Copper Foil. It was further subjected to heat treatment in an oven at 130° C. for 30 minutes.

(2) Lamination of Copper Foil and Formation of Insulating Layer

As an internal layer circuit substrate, a double-sided copper clad layered body with an epoxy resin-glass cloth base material having an internal layer circuit formed therein (the thickness of the copper foil: 18 μm, the thickness of the substrate: 0.4 mm, "R1515A" manufactured by Panasonic Corporation) was prepared. Then, the adhesive film obtained in Examples and Comparative Examples was laminated on both sides of the internal layer circuit substrate using a batch-type vacuum pressure laminator ("MVLP-500" manufactured by Meiki Co., Ltd.) so that the resin composition layer was in contact with the internal layer circuit substrate. The lamination treatment was performed by reducing the pressure for 30 seconds to an air pressure of 13 hPa or less and then pressing for 30 seconds at 100° C. and a pressure of 0.74 MPa. After the lamination, the PET film was removed. Onto the exposed resin composition layer, the treated face of CZ Copper Foil was laminated with the same conditions as the above. Subsequently, the resin composition layer was cured with a curing condition of 190° C. and 90 minutes to form an insulating layer, thus producing a sample having a structure of CZ Copper Foil/the insulating layer/the double-sided copper clad layered body with an epoxy resin-glass cloth base material/the insulating layer/CZ Copper Foil.

Measurement of Adhesiveness with Copper Foil (Adhesiveness 1)

The produced sample was cut into a small piece with a size of 150 mm×30 mm. Cuts were made in a portion of 10 mm in width and 100 mm in length in a copper foil part of the small piece using a cutter. One end of the copper foil in the longitudinal direction was peeled and held by a holder ("AC-50C-SL" manufactured by TSE Corporation), and a load at the time of peeling to an extent of 35 mm in a vertical direction at a speed of 50 mm/minute at room temperature using an Instron type universal tester was measured based on JIS C6481. The load thus measured is referred to as "Adhesiveness 1".

Measurement of Adhesiveness with Copper Foil after High-Temperature and High-Humidity Environmental Test (HAST) (Adhesiveness 2)

The produced sample was subjected to an accelerated environmental test with a condition of 130° C. and 85% RH for 100 hours using a highly accelerated life testing apparatus ("PM422" manufactured by Kusumoto Chemicals, Ltd.). Then, similarly to the measurement of Adhesiveness 1, a cut was made, and one end of the copper foil in the longitudinal direction was peeled and held by a holder ("AC-50C-SL" manufactured by TSE Corporation), and a load at the time of peeling to an extent of 35 mm in a vertical direction at a speed of 50 mm/minute at room temperature using an Instron type universal tester was measured based on JIS C6481. The load thus measured is referred to as "Adhesiveness 2".

A case in which the measurement result in Adhesiveness 2 was lower than 0.25 kgf/cm was evaluated as "NG", whereas a case in which it was 0.25 kgf/cm or more was evaluated as "OK".

<Measurement of Dielectric Tangent and Mechanical Characteristics (Elongation)>

The adhesive film obtained in Examples and Comparative Examples was cured at 200° C. for 90 minutes, and then the support was removed, thus producing a sample for evaluating curing property.

Measurement of Dielectric Tangent

A test piece with a width of 2 mm and a length of 80 mm was cut out from the sample for evaluating curing property. For the test piece, dielectric tangent was measured by the cavity resonance perturbation method at a measurement frequency of 5.8 GHz and a measurement temperature of 23° C. using "HP8362B" manufactured by Agilent Technologies, Inc. Measurement was performed for two test pieces, and an average was calculated.

A case in which the average of the dielectric tangent was lower than 0.0058 was evaluated as "OK", whereas a case in which it was 0.0058 or more was evaluated as "NG".

Measurement of Elongation at Break

Tensile strength measurement was performed using a tensile tester "RTC-1250A" manufactured by Orientec Corporation to measure elongation at break at 23° C. Measurement was performed based on JIS K7127. Measurement was performed five times, and an average of the upper three values was calculated.

A case in which the average of elongation at break was less than 1.6% was evaluated as "NG", whereas a case in which it was 1.6% or more was evaluated as "OK".

Example 1

10 parts of a bisphenol A type epoxy resin ("828US" manufactured by Mitsubishi Chemical Corporation, epoxy equivalent of 180 g/eq), 5 parts of a naphthol type epoxy resin ("ESN475V" manufactured by Nippon Steel & Sumikin Chemical Co., Ltd., epoxy equivalent of 330 g/eq), and 10 parts of a bisphenol AF type epoxy resin ("YL7760" manufactured by Mitsubishi Chemical Corporation, epoxy equivalent of 238 g/eq) were heated and dissolved in 30 parts of methyl ethyl ketone (MEK) with stirring. After the resultant solution was cooled to room temperature, 30 parts of an active ester resin ("HPC-8000-65T" manufactured by DIC Corporation, active ester group equivalent of 223 g/eq, toluene solution having a non-volatile content of 65% by mass), 5 parts of a phenol resin ("LA-3018-50P" manufactured by DIC Corporation, phenolic hydroxy group equivalent of 151 g/eq, 2-methoxypropanol solution having a non-volatile content of 50%), 20 parts of an acrylic group-containing resin ("A-DCP" manufactured by Shin-Nakamura Chemical Co., Ltd., radical polymerizable functional group equivalent of 152 g/eq), 20 parts of a vinyl group-containing active ester resin ("PC1300-02-65MA" manufactured by Air Water Inc., active ester group equivalent of 199 g/eq, radical polymerizable functional group equivalent of 1,400 g/eq, methyl amyl ketone solution having a non-volatile content of 65%), 5 parts of a phenoxy resin ("YL7553BH30" manufactured by Mitsubishi Chemical Corporation, a 1:1 solution of MEK:cyclohexanone having a non-volatile content of 30% by mass), 3 parts of a curing accelerator (4-dimethylamino pyridine (DMAP), MEK solution having a non-volatile content of 5% by mass), 0.6 part of dicumyl peroxide ("Percumyl D" manufactured by NOF Corporation), and 150 parts of spherical silica ("SO-C2" manufactured by Admatechs Company Limited, average particle diameter of 0.5 μm) surface-treated with an amine-based silane coupling agent ("KBM573" manufactured by Shin-Etsu Chemical Co., Ltd.) were mixed thereinto. The resultant mixture was homogeneously dispersed with a high-speed rotary mixer, and then filtered with a cartridge filter ("SHP020" manufactured by ROKITECHNO), thus preparing Resin Varnish 1.

Then, Resin Varnish 1 was uniformly applied onto a release layer of a PET film with an alkyd resin-based release layer ("AL-5" manufactured by Lintec Corporation, thickness of 38 μm) with a die coater such that a thickness of a resin composition layer after drying was 40 μm. The applied resin composition was dried at 80° C. to 110° C. (average: 95° C.) for 5 minutes, thus producing Adhesive Film 1.

Example 2

Resin Varnish 2 and Adhesive Film 2 were produced in the same manner as in Example 1 except that 10 parts of an allyl group-containing epoxy resin ("RE810-NM" manufactured by Nippon Kayaku Co., Ltd., epoxy group equivalent of 221 g/eq, radical polymerizable functional group equivalent of 221 g/eq) was used in place of 10 parts of the bisphenol A type epoxy resin ("828US" manufactured by Mitsubishi Chemical Corporation).

Example 3

Resin Varnish 3 and Adhesive Film 3 were produced in the same manner as in Example 1 except that the vinyl group-containing active ester resin ("PC1300-02-65MA" manufactured by Air Water Inc.) was not added and that the addition amount of the active ester resin ("HPC-8000-65T" manufactured by DIC Corporation) was changed from 30 parts to 50 parts.

Example 4

5 parts of a phenol resin ("LA-3018-50P" manufactured by DIC Corporation, phenolic hydroxy group equivalent of 151 g/eq, 2-methoxypropanol solution having a non-volatile content of 50%), 10 parts of a styryl group-containing resin ("OPE-2St 1200" manufactured by Mitsubishi Gas Chemical Company, Inc., radical polymerizable functional group equivalent of 630 g/eq, toluene solution having a non-volatile content of 60%), 50 parts of a vinyl group-containing active ester resin ("PC1300-02-65MA" manufactured by Air Water Inc., active ester group equivalent of 199 g/eq, radical polymerizable group equivalent of 1,400 g/eq, methyl amyl ketone solution having a non-volatile content of 65%), 25 parts of an allyl group-containing epoxy resin ("RE810-NM" manufactured by Nippon Kayaku Co., Ltd., epoxy group equivalent of 221 g/eq, radical polymerizable functional group equivalent of 221 g/eq), 5 parts of a phenoxy resin ("YL7553BH30" manufactured by Mitsubishi Chemical Corporation, a 1:1 solution of MEK:cyclohexanone having a non-volatile content of 30% by mass), 3 parts of a curing accelerator (DMAP, MEK solution having a non-volatile content of 5% by mass), 0.6 part of dicumyl peroxide ("Percumyl D" manufactured by NOF Corporation), and 150 parts of spherical silica ("SO-C2" manufactured by Admatechs Company Limited, average particle diameter of 0.5 μm) surface-treated with an amine-based silane coupling agent ("KBM573" manufactured by Shin-Etsu Chemical Co., Ltd.) were mixed. The resultant mixture was homogeneously dispersed with a high-speed rotary mixer, and filtered with a cartridge filter ("SHP020" manufactured by ROKITECHNO), thus preparing Resin Varnish 4.

Adhesive Film 4 was produced in the same manner as in Example 1 using Resin Varnish 4 thus obtained.

Example 5

Resin Varnish 5 and Adhesive Film 5 were produced in the same manner as in Example 4 except that (1) the addition amount of the phenol resin ("LA-3018-50P" manufactured by DIC Corporation) was changed from 5 parts to 1 part, (2) the addition amount of the styryl group-containing resin ("OPE-2St 1200" manufactured by Mitsubishi Gas Chemical Company) was changed from 10 parts to 1 part, (3) the addition amount of the vinyl group-containing active ester resin ("PC1300-02-65MA" manufactured by Air Water Inc.) was changed from 50 parts to 55 parts, and (4) the addition amount of the allyl group-containing epoxy resin ("RE810-NM" manufactured by Nippon Kayaku Co., Ltd.) was changed from 25 parts to 30 parts.

Example 6

Resin Varnish 6 and Adhesive Film 6 were produced in the same manner as in Example 2 except that 10 parts of a styryl group-containing resin ("OPE-2St 1200" manufactured by Mitsubishi Gas Chemical Company, Inc.) was used in place of 20 parts of the acrylic group-containing resin ("A-DCP" manufactured by Shin-Nakamura Chemical Co., Ltd.).

Example 7

Resin Varnish 7 and Adhesive Film 7 were produced in the same manner as in Example 6 except that 20 parts of a carbodiimide resin ("V-03" manufactured by Nisshinbo Chemical Inc., carbodiimide group equivalent of 216 g/eq, toluene solution having a non-volatile content of 50% by mass) was used in place of 5 parts of the phenol resin ("LA-3018-50P" manufactured by DIC Corporation).

Example 8

Resin Varnish 8 and Adhesive Film 8 were produced in the same manner as in Example 6 except that 10 parts of a bismaleimide resin ("MIR-3000-70MT" manufactured by Nippon Kayaku Co., Ltd., radical polymerizable group equivalent of 275 g/eq, toluene solution having a non-volatile content of 70% by mass) was used in place of 10 parts of the styryl group-containing resin ("OPE-2St 1200" manufactured by Mitsubishi Gas Chemical Company, Inc.).

Example 9

Resin Varnish 9 and Adhesive Film 9 were produced in the same manner as in Example 3 except that 10 parts of an allyl group-containing epoxy resin ("RE820" manufactured by Nippon Kayaku Co., Ltd., epoxy group equivalent of 228 g/eq, radical polymerizable group equivalent of 228 g/eq) was used in place of 10 parts of the allyl group-containing epoxy resin ("RE810-NM" manufactured by Nippon Kayaku Co., Ltd.).

Example 10

Resin Varnish 10 and Adhesive Film 10 were produced in the same manner as in Example 3 except that 10 parts of an allyl group-containing phenol resin ("MEH-8000H" manufactured by Meiwa Plastic Industries, Ltd., phenolic hydroxy group equivalent of 140 g/eq, radical polymerizable functional group equivalent of 140 g/eq) was used in place of 10 parts of the allyl group-containing epoxy resin ("RE810-NM" manufactured by Nippon Kayaku Co., Ltd.).

Comparative Examples 1 to 8

Resin Varnishes 11 to 18 were prepared of Comparative Examples 1 to 8, respectively, in accordance with addition amounts listed in the table below. Adhesive Films 11 to 18 were produced in the same manner as in Example 1.

Table 1 lists evaluation results of the individual Examples and Comparative Examples.

TABLE 1

| | | | | Examples | | | | | |
|---|---|---|---|---|---|---|---|---|---|
| | | | | 1 | 2 | 3 | 4 | 5 | 6 |
| Resin composition | Components (*parts by mass) | (A) | 828US | 10 | | | | | |
| | | | YL7760 | 10 | 10 | 10 | | | 10 |
| | | | ESN475V | 5 | 5 | 5 | | | 5 |
| | | | HPC8000-65T | 19.5 | 19.5 | 32.5 | | | 19.5 |
| | | | LA3018 | 2.5 | 2.5 | 2.5 | 2.5 | 0.5 | 2.5 |
| | | | V03 | | | | | | |
| | | (B) | A-DCP | 20 | 20 | 20 | | | |
| | | | OPE-2St 1200 | | | | 6 | 0.6 | 6 |
| | | | MIR-3000-70MT | | | | | | |
| | | (C) | PC1300-65MA | 13 | 13 | | 32.5 | 35.75 | 13 |
| | | | RE-810NM | | | 10 | 25 | 30 | 10 |
| | | | RE-820 | | | | | | |
| | | | MEH8000H | | | | | | |
| | | (D) | SO—C2 | 150 | 150 | 150 | 150 | 150 | 150 |
| | | Others | YL7553BH30 | 1.5 | 1.5 | 1.5 | 1.5 | 1.5 | 1.5 |
| | | | DMAP-5M | 0.15 | 0.15 | 0.15 | 0.15 | 0.15 | 0.15 |
| | | | Percumyl D | 0.6 | 0.6 | 0.6 | 0.6 | 0.6 | 0.6 |
| | non-volatile component | | | 232.25 | 232.25 | 232.25 | 218.25 | 219.1 | 218.25 |
| | $n_a$*1 | | | 0.301 | 0.686 | 0.206 | 16.697 | 95.249 | 0.686 |
| | $n_b$*2 | | | 0.071 | 0.414 | 0.344 | 14.315 | 169.346 | 5.726 |
| Evaluation result | Dielectric characteristics | | Df | 0.0055 | 0.0056 | 0.0052 | 0.0055 | 0.0054 | 0.0048 |
| | | | Evaluation | OK | OK | OK | OK | OK | OK |
| | Mechanical strength | | Elongation(%) | 2 | 2.1 | 1.9 | 1.7 | 1.7 | 1.7 |
| | | | Evaluation | OK | OK | OK | OK | OK | OK |
| | Adhesiveness with copper foil | | Adhesiveness 1 | 0.62 | 0.66 | 0.63 | 0.61 | 0.6 | 0.68 |

TABLE 1-continued

|  |  |  |  | | | | | | |
|---|---|---|---|---|---|---|---|---|---|
| (kgf/cm) | | | Adhesiveness 2 | 0.32 | 0.35 | 0.28 | 0.32 | 0.35 | 0.3 |
| | | | Evaluation | OK | OK | OK | OK | OK | OK |

| | | | | Examples | | | | Comparative examples | |
|---|---|---|---|---|---|---|---|---|---|
| | | | | 7 | 8 | 9 | 10 | 1 | 2 |
| Resin composition | Components (*parts by mass) | (A) | 828US | | | | | 10 | 1 |
| | | | YL7760 | 10 | 10 | 10 | 10 | 10 | 1 |
| | | | ESN475V | 5 | 5 | 5 | 5 | 5 | 1 |
| | | | HPC8000-65T | 19.5 | 19.5 | 32.5 | 32.5 | 32.5 | 0.65 |
| | | | LA3018 | | 2.5 | 2.5 | 2.5 | 2.5 | 0.5 |
| | | | V03 | 10 | | | | | |
| | | (B) | A-DCP | | | 20 | 20 | 20 | 20 |
| | | | OPE-2St 1200 | 6 | | | | | |
| | | | MIR-3000-70MT | | 7 | | | | |
| | | (C) | PC1300-65MA | 13 | 13 | | | | 0.65 |
| | | | RE-810NM | 10 | 10 | | | | |
| | | | RE-820 | | | 10 | | | |
| | | | MEH8000H | | | | 10 | | |
| | | (D) | SO—C2 | 150 | 150 | 150 | 150 | 150 | 50 |
| | | Others | YL7553BH30 | 1.5 | 1.5 | 1.5 | 1.5 | 1.5 | 1.5 |
| | | | DMAP-5M | 0.15 | 0.15 | 0.15 | 0.15 | 0.15 | 0.15 |
| | | | Percumyl D | 0.6 | 0.6 | 0.6 | 0.6 | 0.6 | 0.6 |
| | non-volatile component | | | 225.75 | 219.25 | 232.25 | 232.25 | 232.25 | 77.05 |
| | $n_a$*1 | | | 0.579 | 0.686 | 0.200 | 0.325 | 0.000 | 0.172 |
| | $n_b$*2 | | | 5.726 | 2.142 | 0.333 | 0.543 | 0.000 | 0.004 |
| Evaluation result | Dielectric characteristics | | Df | 0.0048 | 0.0053 | 0.0054 | 0.0056 | 0.0052 | 0.0056 |
| | | | Evaluation | OK | OK | OK | OK | OK | OK |
| | Mechanical strength | | Elongation(%) | 1.8 | 1.8 | 1.8 | 1.7 | 1.5 | 1.5 |
| | | | Evaluation | OK | OK | OK | OK | NG | NG |
| | Adhesiveness with copper foil (kgf/cm) | | Adhesiveness 1 | 0.65 | 0.65 | 0.61 | 0.58 | 0.6 | 0.5 |
| | | | Adhesiveness 2 | 0.32 | 0.32 | 0.27 | 0.28 | 0.2 | 0.15 |
| | | | Evaluation | OK | OK | OK | OK | NG | NG |

| | | | | Comparative examples | | | | | |
|---|---|---|---|---|---|---|---|---|---|
| | | | | 3 | 4 | 5 | 6 | 7 | 8 |
| Resin composition | Components (*parts by mass) | (A) | 828US | | | | 70 | 10 | 10 | 10 |
| | | | YL7760 | | | | | 10 | 10 |
| | | | ESN475V | | | 5 | 90 | 5 | 5 |
| | | | HPC8000-65T | | 32.5 | 32.5 | 32.5 | 32.5 | 32.5 |
| | | | LA3018 | 0.25 | 2.5 | 2.5 | 2.5 | 2.5 | 2.5 |
| | | | V03 | | | | | | |
| | | (B) | A-DCP | 20 | | 5 | 5 | | |
| | | | OPE-2St 1200 | | 0.6 | | | 6 | |
| | | | MIR-3000-70MT | | | | | | 7 |
| | | (C) | PC1300-65MA | | | | | | |
| | | | RE-810NM | 100 | 100 | 1 | 1 | | |
| | | | RE-820 | | | | | | |
| | | | MEH8000H | | | | | | |
| | | (D) | SO—C2 | 200 | 200 | 220 | 280 | 150 | 150 |
| | | Others | YL7553BH30 | 6 | 6 | 1.5 | 1.5 | 1.5 | 1.5 |
| | | | DMAP-5M | 0.15 | 0.15 | 0.15 | 0.15 | 0.15 | 0.15 |
| | | | Percumyl D | 0.6 | 0.6 | 0.6 | 0.6 | 0.6 | 0.6 |
| | non-volatile component | | | 327 | 342.35 | 338.25 | 423.25 | 218.25 | 219.25 |
| | $n_a$*1 | | | 273.303 | 2.788 | 0.008 | 0.009 | 0.000 | 0.000 |
| | $n_b$*2 | | | 3.439 | 475.113 | 0.138 | 0.138 | 0.000 | 0.000 |
| Evaluation result | Dielectric characteristics | | Df | 0.01 | 0.0056 | 0.007 | 0.0062 | 0.0048 | 0.0053 |
| | | | Evaluation | NG | OK | NG | NG | OK | OK |
| | Mechanical strength | | Elongation(%) | 1.8 | 1.3 | 2.2 | 1.1 | 1.2 | 1.2 |
| | | | Evaluation | OK | NG | OK | NG | NG | NG |
| | Adhesiveness with copper foil (kgf/cm) | | Adhesiveness 1 | 0.45 | 0.6 | 0.7 | 0.6 | 0.62 | 0.6 |
| | | | Adhesiveness 2 | 0.2 | 0.21 | 0.23 | 0.18 | 0.2 | 0.17 |
| | | | Evaluation | NG | NG | NG | NG | NG | NG |

*In terms of non-volatile components
*1 The number of the functional group FA' of the component (C) when the number of the thermosetting functional group FA of the component (A) is defined as 1.
*2 The number of the functional group FB' of the component (C) when the number of the radical polymerizable functional group FB of the component (B) is defined as 1.

It has been revealed that a case in which the spherical silica "SO-C2" is not added and a case in which the curing accelerator (dimethylamino pyridine (DMAP) and "Percumyl D") is not added also arrive at results more or less similar to those of Examples.

What is claimed is:

1. A resin composition, comprising:
   (A) a resin having a thermosetting functional group FA;
   (B) a resin having a radical polymerizable functional group FB which is an ethylenic unsaturated group other than a maleimide group;
   (C) a resin having a functional group FA' which reacts with the thermosetting functional group FA and a functional group FB' which reacts with the radical polymerizable functional group FB; and
   (D) an inorganic filler, wherein
   the functional group FA' of the component (C) is one or more members selected from the group consisting of an epoxy group, a benzoxazine group, a cyanate ester group, an active ester group, a carbodiimide group, an oxetanyl group, an episulfide group, an isocyanate group, and an amino group,
   a number $n_a$ of the functional group FA' of the component (C) when the number of the thermosetting functional group FA of the component (A) is defined as 1 and a number $n_b$ of the functional group FB' of the component (C) when the number of the radical polymerizable functional group FB of the component (B) is defined as 1 satisfy $0.01 \leq n_a \leq 200$ and $0.01 \leq n_b \leq 400$, and a content of the component (D) in the resin composition is more than 60% by mass.

2. The resin composition according to claim 1, wherein the thermosetting functional group FA is one or more selected from the group consisting of an epoxy group, a phenolic hydroxy group, a benzoxazine group, a cyanate ester group, an active ester group, a carbodiimide group, an acid anhydride group, an oxetanyl group, an episulfide group, an isocyanate group, and an amino group.

3. The resin composition according to claim 1, wherein the radical polymerizable functional group FB is one or more selected from the group consisting of an acrylic group, a methacrylic group, a styryl group, an allyl group, a vinyl group, and a propenyl group.

4. The resin composition according to claim 1, wherein the functional group FB' of the component (C) is one or more selected from the group consisting of an acrylic group, a methacrylic group, a styryl group, an allyl group, a vinyl group, a propenyl group, and a maleimide group.

5. The resin composition according to claim 1, wherein the resin composition is suitable for forming an insulating layer on which a conductive layer is to be formed.

6. The resin composition according to claim 1, wherein the resin composition is suitable for forming an insulating layer of a printed wiring board.

7. A sheet-shaped laminated material containing the resin composition according to claim 1.

8. A printed wiring board containing a cured product of the resin composition according to claim 1.

9. A semiconductor device containing a cured product of the resin composition according to claim 1.

10. The resin composition according to claim 1, wherein the component (C) is selected from the group consisting of a compound represented by Formula (C1) below, a compound represented by Formula (C2) below, and a compound represented by Formula (C3) below:

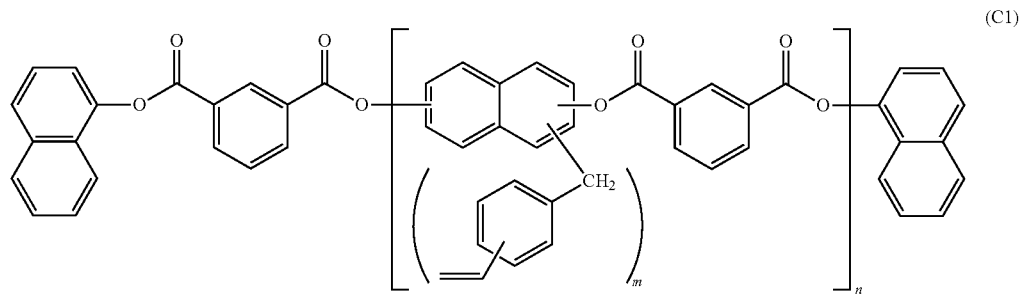

(C1)

wherein, m represents an integer of 1 to 6, and n represents an integer of 1 to 20;

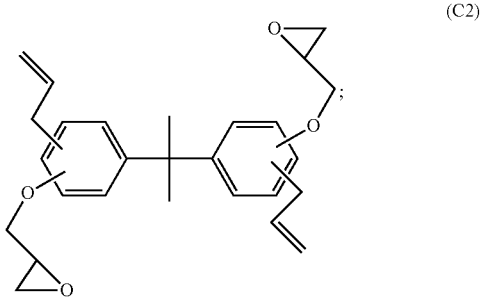

(C2)

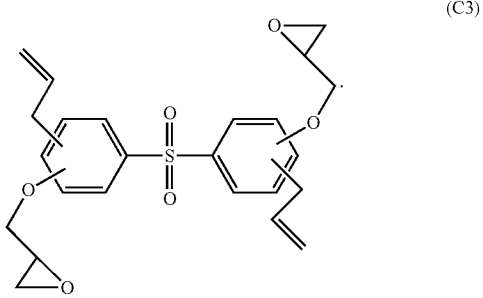

(C3)

11. A resin composition, comprising:
   (A) a resin having a thermosetting functional group FA;
   (B) a resin having a radical polymerizable functional group FB which is an ethylenic unsaturated group;
   (C) a resin having a functional group FA' which reacts with the thermosetting functional group FA and a functional group FB' which reacts with the radical polymerizable functional group FB, where the component (C) is not a compound represented by Formula (C2) below:

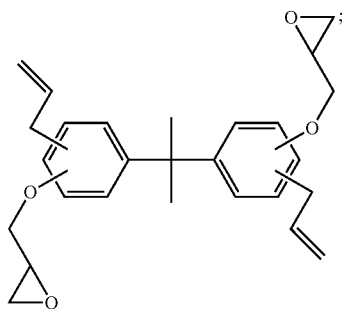

(C2)

and (D) an inorganic filler, wherein a number $n_a$ of the functional group FA' of the component (C) when the number of the thermosetting functional group FA of the component (A) is defined as 1 and a number $n_b$ of the functional group FB' of the component (C) when the number of the radical polymerizable functional group FB of the component (B) is defined as 1 satisfy $0.01 \leq n_a \leq 200$ and $0.01 \leq n_b \leq 400$, and the content of the component (D) in the resin composition is more than 60% by mass.

12. The resin composition according to claim 11, wherein the content of the component (D) in the resin composition is 64.58% by mass or more.

* * * * *